United States Patent
Yoshikawa

Patent Number: 6,015,594
Date of Patent: Jan. 18, 2000

[54] METHOD AND APPARATUS FOR FORMING A FILM BY SPUTTERING PROCESS

[75] Inventor: Toshiaki Yoshikawa, Kawasaki, Japan

[73] Assignee: Canon Kabushiki Kaisha, Tokyo, Japan

[21] Appl. No.: 08/480,343

[22] Filed: Jun. 7, 1995

Related U.S. Application Data

[62] Division of application No. 08/201,099, Feb. 24, 1994, Pat. No. 5,449,444, which is a continuation of application No. 07/946,461, filed as application No. PCT/JP92/00333, Mar. 19, 1992, abandoned.

[30] Foreign Application Priority Data

Mar. 20, 1991 [JP] Japan ................................. 3-080367

[51] Int. Cl.[7] ................................ B05D 3/00; C23C 14/34
[52] U.S. Cl. ............................ 427/398.1; 204/192.12; 204/298.06; 204/298.09; 204/298.11; 427/294; 427/314; 118/723 R; 118/724
[58] Field of Search ................... 204/192.12, 298.06, 204/298.09, 298.11; 427/294, 314, 398.1; 118/724, 723 R

[56] References Cited

U.S. PATENT DOCUMENTS

| | | | |
|---|---|---|---|
| 4,236,994 | 12/1980 | Dugdale | 204/298.09 |
| 4,597,844 | 7/1986 | Hiraki et al. | 204/298.19 |
| 4,818,359 | 4/1989 | Jones et al. | 204/298.06 |
| 4,897,172 | 1/1990 | Katsura et al. | 204/298.11 |
| 4,933,063 | 6/1990 | Katsura et al. | 204/298.11 X |
| 4,941,915 | 7/1990 | Matsuoka et al. | 204/298.12 |
| 4,986,890 | 1/1991 | Setoyama et al. | 204/298.11 |
| 5,071,535 | 12/1991 | Hartig et al. | 204/298.12 |
| 5,174,881 | 12/1992 | Iwasaki et al. | 204/298.25 |
| 5,290,758 | 3/1994 | Wordenweber | 204/298.24 |
| 5,294,320 | 3/1994 | Somekh et al. | 204/298.08 |
| 5,306,405 | 4/1994 | Lorentz et al. | 204/192.12 |
| 5,382,339 | 1/1995 | Aranovich | 204/298.11 |
| 5,449,444 | 9/1995 | Yoshikawa | 204/298.11 X |

*Primary Examiner*—Nam Nguyen
*Assistant Examiner*—Steven H. Ver Steeg
*Attorney, Agent, or Firm*—Fitzpatrick, Cella, Harper & Scinto

[57] ABSTRACT

A film-forming method and apparatus for forming a deposited film on a substrate employing plasma generated by a raw material gas for film formation in a film-forming chamber involves several steps. The method includes arranging a deposition preventive member in the film-forming chamber so that the deposition preventive member prevents a film from being deposited on an inner wall of the chamber during film formation. A heater and a cooler are alternately arranged on a face of the deposition preventive member. Prior to commencing film deposition, the deposition preventive member is heated using the heater. During film formation, the deposition preventive member is cooled by the cooler to prevent the deposition preventive member from releasing contaminants.

6 Claims, 15 Drawing Sheets

METHOD AND APPARATUS FOR FORMING A FILM BY SPUTTERING PROCESS

This application is a division of application Ser. No. 08/201,099 filed Feb. 24, 1994 now U.S. Pat. No. 5,449,444, which was a continuation of application Ser. No. 07/946,461 filed Nov. 18, 1992, as PCT/JP92/00333, filed Mar. 14, 1992 which is now abandoned.

FIELD OF THE INVENTION

The present invention relates to a method for forming a semiconductor film on a substrate such as a single crystal wafer or the like by a sputtering process in the production of various semiconductor devices and an apparatus suitable for practicing said method.

BACKGROUND OF THE INVENTION

In semiconductor devices, particularly semiconductor devices having a multi-layered structure comprising a plurality of stacked thin films, not only the quality of each of the constituent thin films but also their interfacial states greatly influence their performances.

Therefore, in order to obtain a high performance semiconductor device having a multi-layered structure, it is extremely important to make each of the constituent semiconductor thin films of a high quality such that it has few defects or is free of defects. Particularly extra care is required when growing a high quality crystalline thin film on a single crystal substrate or a crystalline thin film by way of epitaxial growth. Various studies have been made to consider this situation.

The formation of a crystalline film by way of epitaxial growth in the prior art is generally performed by means of a CVD process. The CVD process to form, for example, a silicon crystalline thin film is usually carried out at a high temperature operation of 1000° C. or above. In this case, there are various restrictions for the related conditions because of the high temperature. Additionally, it is difficult to satisfy the requirements of shallowing or/and steeply grading a dopant profile in the case of obtaining a highly integrated semiconductor device of a high performance. In view of this, in recent years, research and development have been centralized not on the CVD process but on MBE (molecular beam epitaxy)(see, for instance, A. Ishizaka and Y. Shiraki, J. Electrochem. Soc., 133, pp. 666 (1986)) and a technique of forming an epitaxial film at low temperature by a sputtering process or the like in which the film formation is performed in an ultra-clean atmosphere.

However, there are disadvantages as for the MBE process. The film formation process is required to be performed at an elevated temperature of at least 800° C. in order to obtain a high quality Si epitaxial thin film and it is difficult to perform high concentration doping. Other than these disadvantages, there is the additional disadvantage that it is necessary to precisely and constantly maintain the liquid level of an evaporation source stored in a crucible at a prescribed temperature. Thus, this process is not always effective to form a high quality epitaxial film over a long period of time since the process control is relatively difficult as above described, and the size of the crucible used is limited.

As for the sputtering process, there are advantages such that the film formation may be performed at relatively low temperature, reproducibility is good, continuous film formation is possible, and the process is relatively easily controllable. However, there are inherent disadvantages for the sputtering process such as deposition of a reaction product caused by plasma reaction on the inner face of the reaction chamber, removal of the reaction product deposited, release of atmospheric component gas adsorbed at the inner wall face of the reaction chamber, and release of the constituent materials of the inner wall face of the reaction chamber as a result of the inner wall face being sputtered during film formation. These foreign matters contaminate the film-forming space, often resulting in their being incorporated into a film formed. These problems cannot be disregarded but they are required to be eliminated to obtain a high quality epitaxial film by the sputtering process. Thus, there is a demand for eliminating these problems.

In order to meet the above demand, there are proposed an apparatus comprising a deposition preventive member disposed in a film-forming chamber such that it circumscribes a plasma generation region including the space between a pair of electrodes, wherein the deposition preventive member serves to prevent foreign matters from depositing on the inner face of the film-forming chamber, and another apparatus of the same constitution as that of the former apparatus, except that the apparatus is designed such that a bias voltage can be applied to the deposition preventive member to prevent the constituent materials of the deposition preventive member from being sputtered out.

Specifically, Japanese Patent Laid-open No. 50962/1990 (hereinafter referred to as "Literature 1") discloses a film-forming apparatus using a sputtering process which comprises a film-forming chamber provided with a deposition preventive member therein and a vacuum chamber in which the deposition preventive member previously used is replaced by a new deposition preventive member. This film-forming apparatus is shown in FIG. 4. In FIG. 4, numeral reference 402 indicates a film-forming chamber for forming a prescribed film on a substrate 433. Numeral reference 400 indicates a deposition preventive member, and numeral reference 406 indicates a vacuum chamber in which the deposition preventive member previously used is replaced by a new deposition preventive member. Numeral reference 425 indicates an opening and closing means which is disposed between the film-forming chamber 402 and the vacuum chamber 406. The deposition preventive member 400 is transported from the vacuum chamber 406 to the film-forming chamber 402 or from the film-forming chamber to the vacuum chamber 406 by means of a transporting means 460. Numeral reference 440 indicates a target, numeral reference 401 indicates a shutter, and numeral references 411 and 412 respectively indicate an exhaust valve. In the vacuum chamber 406, there is disposed a baking means 450 which serves to release gas adsorbed at the surface of the deposition preventive member 400.

The film formation in the film-forming apparatus shown in FIG. 4 is carried out in the following manner. That is, the deposition preventive member 400 is subjected to baking treatment in the vacuum chamber 406, followed by transporting the deposition preventive member thus treated into the film-forming chamber 402 by means of the transporting means 460. Film formation is performed by a sputtering process in the film-forming chamber 402 to form a deposited film on a substrate 433 arranged in the film-forming chamber.

According to the film-forming apparatus shown in FIG. 4, film formation may be efficiently performed since deposition of the foregoing reaction product onto the inner face of the film-forming chamber 402 is prevented by the deposition preventive member 400 and the deposition preventive member 400 previously used can be replaced by a new deposition preventive member.

However, in using this apparatus, gases originating from the atmospheric component gas such as $H_2O$, $CO_2$, $O_2$, etc. remaining in the vacuum chamber 406 become adsorbed at the deposition preventive member 400 as the temperature of the deposition preventive member decreases, no matter how much the deposition preventive member had been subjected to baking treatment in the vacuum chamber. The adsorption of these gases at the deposition preventive member is unavoidably caused even in the case where the inside of the vacuum chamber 406 is evacuated to a high vacuum degree. This results in a problem occurring when the deposition preventive member 400 into the film-forming chamber 402 and film formation is performed therein so that the deposition preventive member 400 is heated not only because of thermal energy from plasma generated in the region circumscribed by the deposition preventive member 400 but also because of thermal energy caused upon heating the substrate. Whereby the gases adsorbed at the deposition preventive member 400 are released to contaminate the film-forming atmosphere. There is also another problem in this case. Charge particles in the plasma collide against the surface of the deposition preventive member 400 to sputter the constituent materials of the deposition preventive member 400 to release those materials, resulting in contaminating the film-forming atmosphere.

Further, The Institute of Electronics, Information and Communication Engineers SDM90-85 ("PRECISION CONTROL OF PLASMA PARAMETERS IN ADVANCED PLASMA PROCESSING EQUIPMENT" (Aug. 31, 1990), pp. 57–61) (hereinafter referred to as "Literature 2") reports a sputtering process capable of performing film formation while applying a voltage to a shield member (a deposition protective member) for the purpose of controlling the potential of plasma.

Literature 2 describes a suggestion that according to the process described therein, metal contamination caused as a result of the shield member being sputtered may be controlled.

However, Literature 2 describes only control of the plasma potential and indicates a mere possibility for the control of metal contamination caused as a result of the shield member being sputtered.

It is presumed that according to this film-forming process, a film of a good quality to certain extent could be formed since the film formation by a sputtering process is carried out in the film-forming space circumscribed by the shield member (the deposition protective member) while applying a bias voltage to the shield member to control the potential of plasma generated in the film-forming space. However, because gases originated from the atmospheric component gas are adsorbed at the shield member as well as the constituent member of the film-forming chamber, these gases are unavoidably released upon performing the film formation to contaminate the film formed.

SUMMARY OF THE INVENTION

The principal object of the present invention is to eliminate the foregoing various problems in the conventional film-forming method by a sputtering process prior art and to provide a film-forming method by a sputtering process which makes it possible to efficiently. form a high quality crystalline semiconductor film which is, substantially free of defects or is extremely few in defects and which satisfies the foregoing demand.

Another object of the present invention is to provide a film-forming method by a sputtering process which makes it possible to efficiently form a high quality crystalline semiconductor film, wherein a specific deposition preventive member is disposed to circumscribe a plasma generation space in a film-forming chamber such that film formation by a sputtering process can be performed while maintaining the film-forming chamber in a very clean state while preventing release of gaseous materials from the deposition preventive member and preventing the constituent materials of the deposition preventive member from being sputtered to release.

A further object of the present invention is to provide a film-forming apparatus suitable for practicing the above film-forming method by sputtering process.

DESCRIPTION OF THE INVENTION

Figure 1:
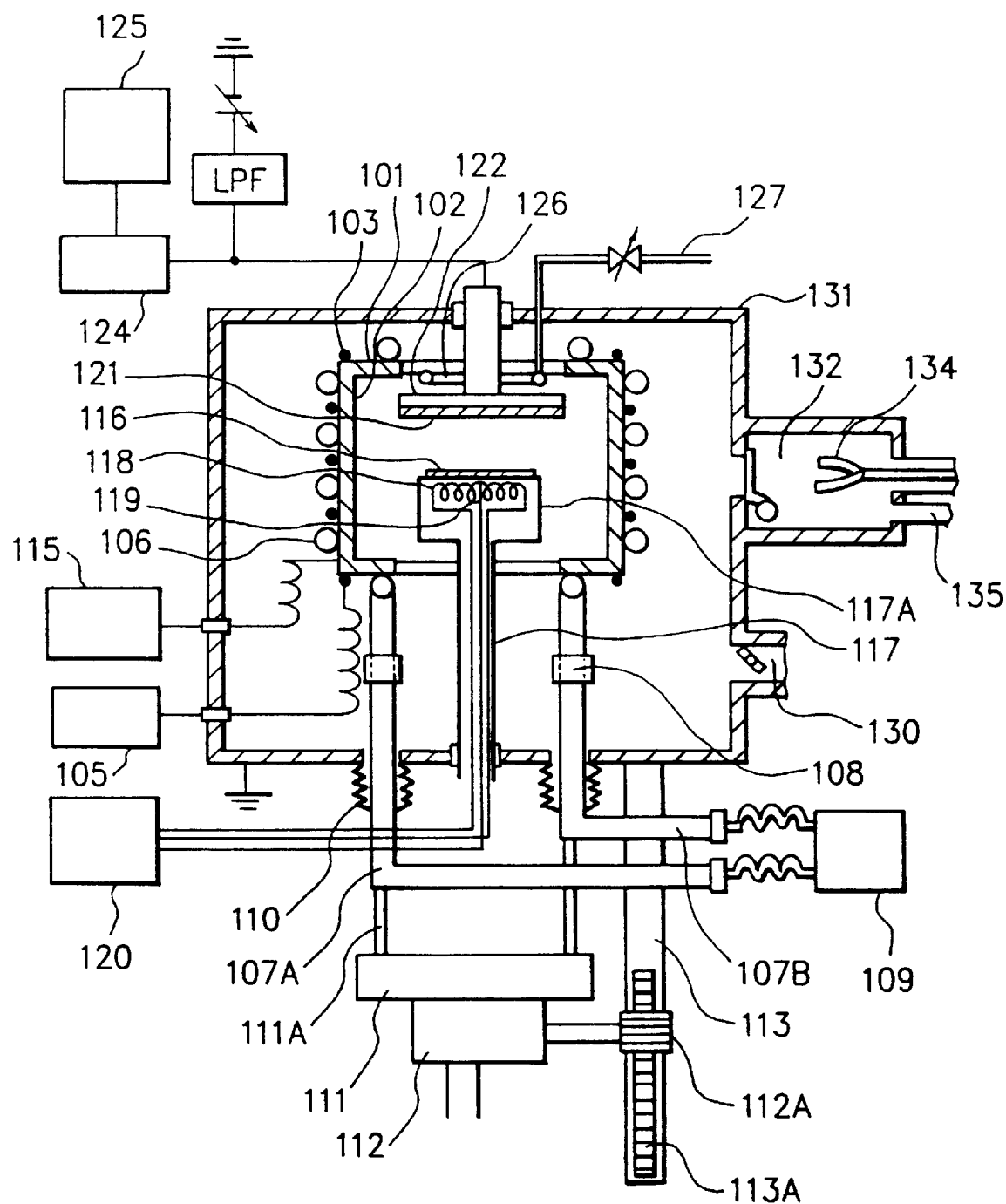
FIG. 1 is a schematic diagram of an embodiment of a film-forming apparatus by sputtering process, according to the present invention.

The present inventor made extensive studies in order to eliminate the foregoing problems in the conventional film-forming method by sputtering process and in order to attain the above objects through experiments which will be later described.

That is, in outline, the present inventor performed film formation by heating a deposition protective member to release gases adsorbed therein, and thereafter, applying a voltage to the deposition preventive member to control the potential of the deposition preventive member to plasma generated in the film-forming chamber while cooling-the deposition preventive member. As a result, the following findings were obtained.

That is, when the deposition preventive member is subjected to baking treatment prior to film formation, and the deposition preventive member is cooled while applying a bias voltage to control the potential of the deposition preventive member during film formation, the foregoing problems in the prior art, namely, (a) the problem that the constituent materials of the deposition preventive member are sputtered to release constituent atoms of those materials and the atoms released contaminate a film deposited on a substrate and (b) the problem that atmospheric component gases are unavoidably adsorbed at the deposition preventive member even after having been subjected to heat treatment (baking treatment) and those gases adsorbed are released due to not only the action of thermal energy radiated from the substrate but also the action of thermal energy radiated from the plasma to contaminate into a film deposited on a substrate, are eliminated at a stroke, wherein the film-forming atmosphere surrounding the substrate is maintained in an extremely clean state, and as a result, an extremely high quality film which is substantially free of defects or has extremely few defects is deposited on the substrate.

The present invention has been accomplished as a result of further studies by the present inventor on the basis of the above findings.

The present invention includes an improved film-forming method by sputtering process and a sputtering apparatus which is suitable for practicing said film-forming method.

The film-forming method by sputtering process according to the present invention has the following constitution.

That is, a film-forming method by sputtering process wherein film formation is performed in a film-forming chamber having a deposition preventive member disposed so as to circumscribe a plasma generation region of the film-forming chamber for the purpose of preventing particles sputtered from a target from depositing on the inner face of the film-forming chamber, characterized in that said film-forming method includes the steps of releasing gases adsorbed in the deposition preventive member by subjecting the deposition preventive member to heat treatment, and performing the film formation while applying a bias voltage to the deposition preventive member to control the potential of the deposition preventive member to the plasma and while cooling the deposition preventive member.

The film-forming apparatus by sputtering process according to the present invention has the following constitution.

That is, a sputtering apparatus comprising a film-forming chamber, a pair of electrodes for causing plasma discharge in the film-forming chamber, and a deposition preventive member being disposed so as to circumscribe a plasma generation region including the space formed between the pair of electrodes, said deposition preventive member being capable of serving to prevent particles sputtered from a target constituting one of the pair of electrodes from depositing on the inner face of the film-forming chamber, characterized in that a portion of the deposition preventive member to be exposed to the plasma generation region is composed of an electroconductive material, the deposition preventive member is provided with means for heating the deposition preventive member and means for cooling the deposition preventive member, and said electroconductive portion of the deposition preventive member is electrically connected to a potential controlling means disposed outside the film-forming chamber.

According to the film-forming method of the present invention, atmospheric component gases unavoidably adsorbed at the deposition preventive member even after having been subjected to heat treatment are prevented from releasing due to not only thermal energy radiated from the heating mechanism of the substrate but also thermal energy radiated from the plasma by cooling the deposition preventive member. In addition, a difference between the potential of the deposition preventive member and the potential of the plasma is desirably decreased by applying a voltage of direct current to the deposition preventive member to reduce ion energy of the plasma to be impinged into the deposition preventive member. Because of this, the constituent materials of the deposition preventive member are prevented from being sputtered. Thus, film formation is carried out in an extremely clean atmosphere, wherein the amount of foreign matter to be contaminated into the resulting film is extremely low. In this respect, it is possible to effectively form a high quality semiconductor film including an epitaxial film, which is usable in various devices, at a relatively low temperature.

According to the apparatus of the present invention, the foregoing film-forming method of the present invention can be desirably practiced, wherein a high quality semiconductor film is efficiently formed with a good reproducibility.

EXPERIMENT 1

Figure 4:
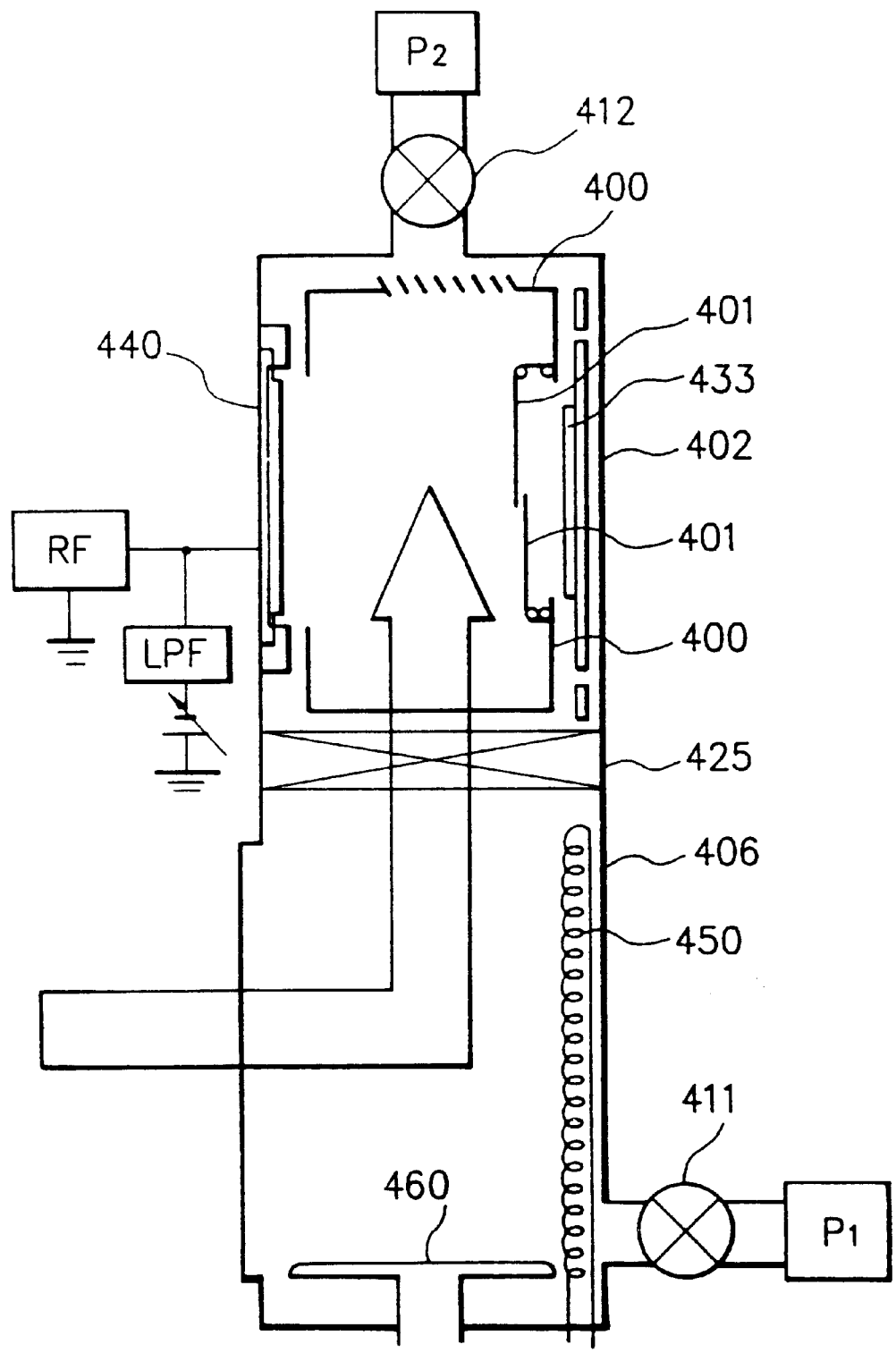
FIG. 4 is a schematic diagram of a sputtering apparatus of the constitution described in Literature 1.

There were formed a plurality of Si films at different substrate temperatures, using a conventional sputtering apparatus shown in FIG. 4 (described in Literature 1).

As for the resultant Si film in each case, the content of each of tantalum (Ta), carbon (C) and oxygen (O) of the film was measured. And in each case, the partial pressure of the residual gas in the film-forming chamber at the substrate temperature prior to introducing Ar gas into the film-forming chamber was measured by means of a quadrupole mass spectrometer (trademark name: QUARDREX 200, produced by Leybold-Inficon Company) (hereinafter referred to as "QMA").

The apparatus shown in FIG. 4 comprises a film-forming chamber 402, a vacuum chamber 406 which serves to deliver or take up a deposition preventive member 400, a loading chamber (not shown) for a substrate 433, a gate valve 425 as an opening and closing means capable of maintaining the film-forming chamber 402 and the vacuum chamber 406 respectively in an airtight state, and a gate valve (not shown) as an opening and closing means capable of maintaining the film-forming chamber 402 and the loading chamber (not shown) respectively in an airtight state.

As the deposition preventive member 400, there was used a member comprising an oxygen-free copper plate applied with a Ta coat to the surface thereof. As the target 440, there was used an n-type (100) Si single crystal plate of $1.8 \times 10^{18}$ cm$^{-3}$ in P-content and of 4 inches in diameter, which had been prepared by a floating zone method (the Si single crystal plate prepared by the floating zone method will be hereinafter referred to as "FZSi single crystal plate"). There was used a p-type FZ (100) Si single crystal wafer of $1.0 \times 10^{15}$ cm$^{-3}$ in B-content and of 2 inches in diameter as substrate 433.

Firstly, the substrate 433 was introduced into the loading chamber (not shown), followed by evacuating the loading chamber and the film-forming chamber 402 to a vacuum of $1 \times 10^{-8}$ Torr. The gate valve (not shown) between the two chambers was opened to introduce the substrate 433 into the film-forming chamber 402. Successively, the deposition preventive member 400 was introduced into the vacuum chamber 406, followed by evacuating the vacuum chamber 406 to a vacuum of $1 \times 10^{-7}$ Torr. Then, a heater 450 was energized to subject the deposition preventive member 400 to baking treatment by maintaining the deposition preventive member at 250° C. for 8 hours. Thereafter, the deposition preventive member 400 was cooled to room temperature. The gate valve 425 was opened, and the deposition preventive member 400 was transported into the film-forming chamber 402 using a transportation means 460. Then, the gate valve 425 was closed. At this time, the residual gas in the film-forming chamber 402 was examined by means of the QMA.

Then, a heater (not shown) for heating the substrate was energized to heat the substrate to 300° C. and the substrate was maintained at this temperature. At this time, the residual gas in the film-forming chamber 402 was examined by means of the QMA.

Successively, Ar gas was introduced through a gas feed pipe (not shown) into the film-forming chamber 402 at a flow rate of 100 sccm, and a high frequency power source connected to the target 440 was switched on to apply a power of 300 W with a frequency of 105 MHz, wherein a power source of direct current connected to a low pass filter (hereinafter referred to as "LPF") was switched on to apply a voltage of −70 V, to thereby cause plasma in the film-forming chamber 402. At this time, the inner pressure of the film-forming chamber was controlled to $8\times10^{-3}$ Torr. After the plasma generated in the film-forming chamber 402 became stable, a shutter 401 was opened, and film formation was conducted for 20 minutes to form a Si film on the substrate 433.

The above film formation was performed at the respective substrate temperatures differing one from another at an interval of 50° C. in the range of from 300° C. to 600° C. As for the resultant Si film in each case, the content, of each of the contaminants Ta, C and O was measured using a secondary ion mass spectrometer (trademark name: IMS-3F, produced by Cameca Company) (hereinafter referred to as "SIMS"). And crystal diffraction was performed by means of electron diffraction (hereinafter referred to as "RHEED").

The results obtained are collectively shown in Table 1. And, the measured results with respect to the content of each of the contaminants Ta, C and O as for the respective Si films formed respectively at a different substrate temperature are graphically shown in FIG. 5(A).

Figure 5A:
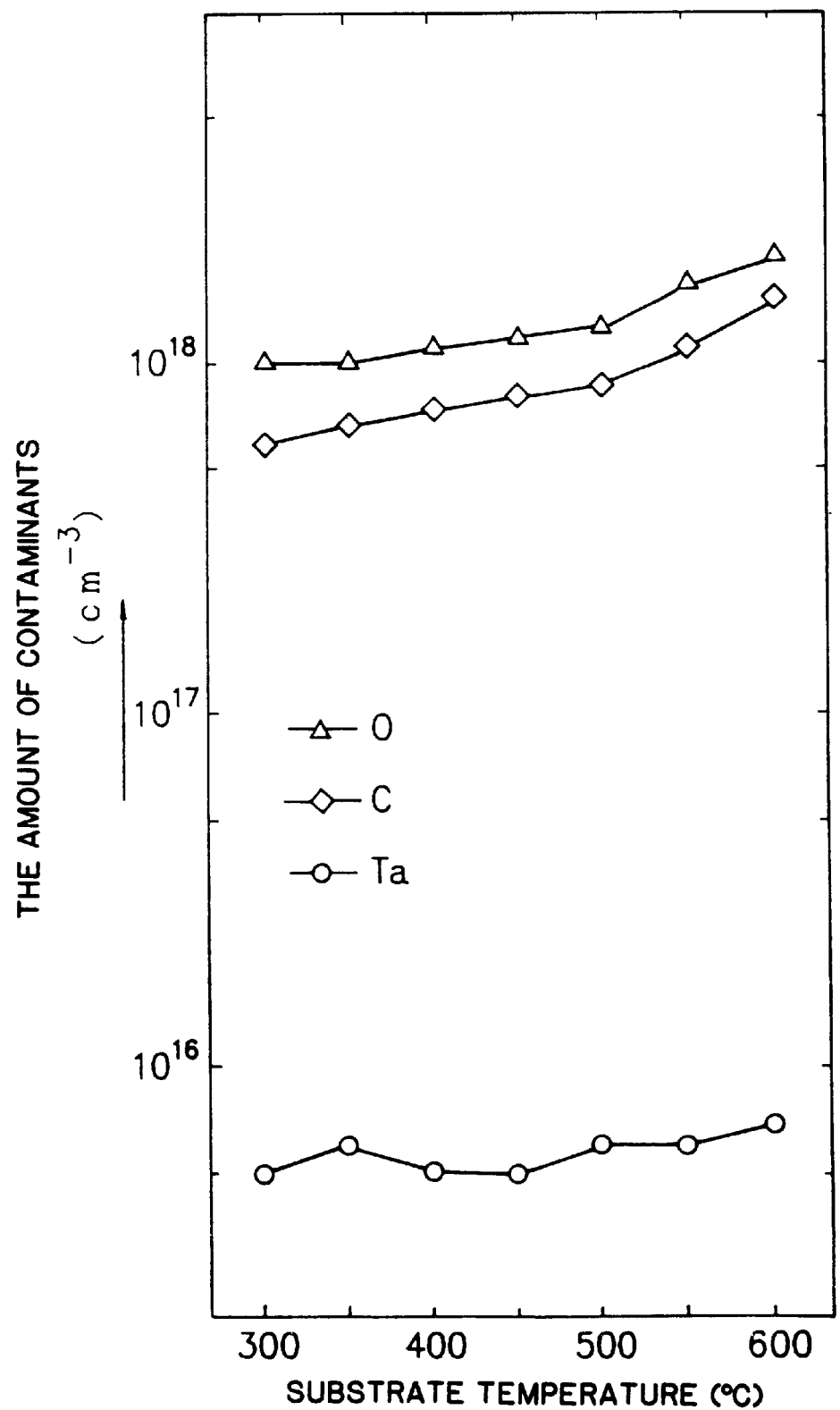
FIG. 5(A) and FIG. 5(B) are graphs respectively showing the results obtained in Experiment 1.
Figure 5B:
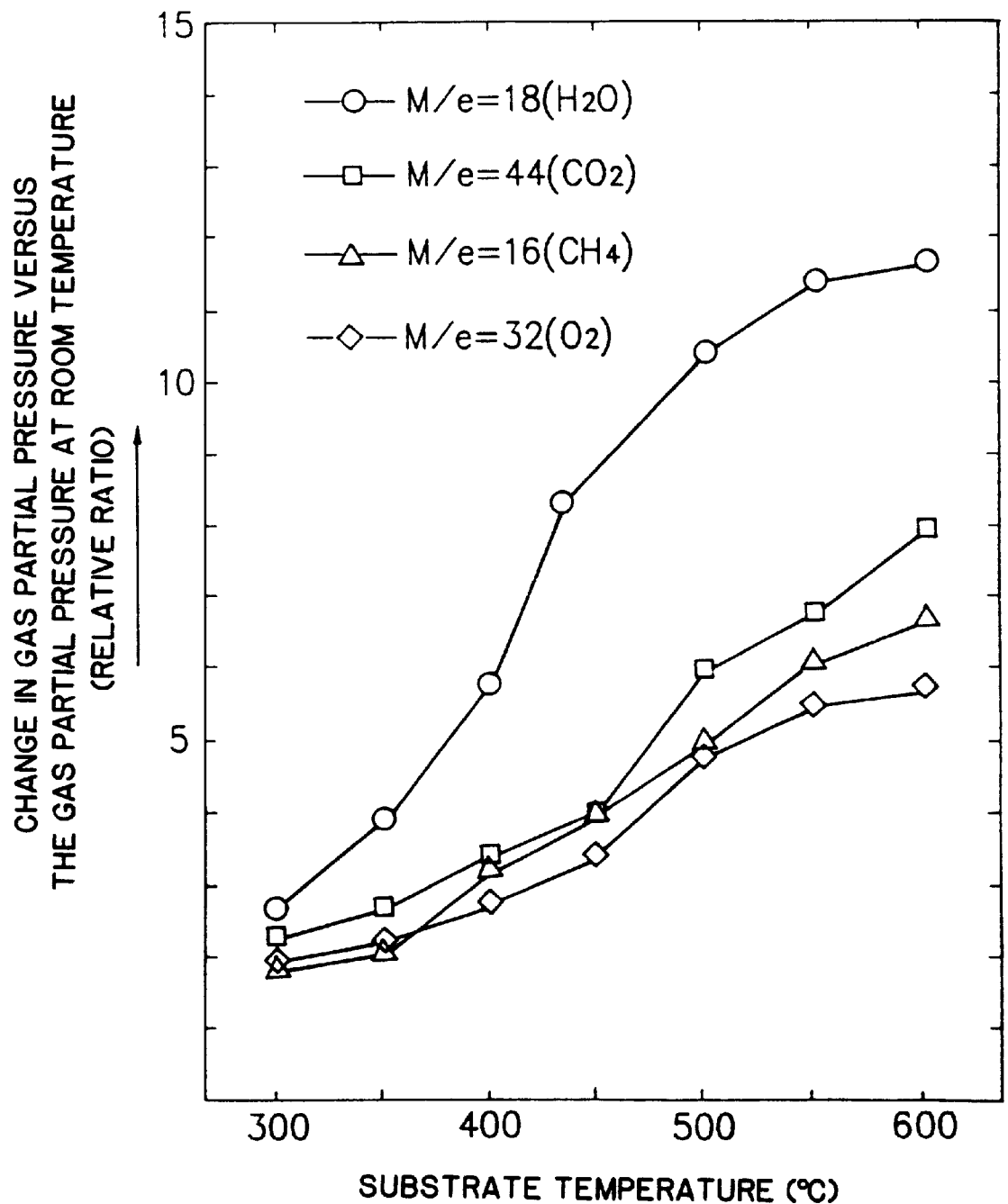

The relative ratios of the measured values by means of the QMA with respect to the gas partial pressure of each of $H_2O$, $CO_2$, $CH_4$ and $O_2$ in the film-forming chamber 404 at the respective substrate temperatures versus the measured values with respect to the gas partial pressure of each of said gases in the film-forming chamber at room temperature are graphically shown in FIG. 5(B).

From the results shown in Table 1, FIG. 5(A) and FIG. 5(B), the following findings are provided. That is, in the film formation at a different substrate temperature in the range of from 300° C. to 600° C., (i) the film obtained in each case shows Kikuchi line in the electron diffraction and is single-crystalline; (ii) any of the films obtained contains a detectable amount of Ta which is the constituent element of the deposition preventive member; (iii) any of the films obtained contains oxygen (O) originated from the atmospheric component gas in a detectable amount which is greater than the amount of Ta described in the above (ii) and said amount increases as the substrate temperature increases; (iv) any of the films obtained contains carbon (C) originated from the atmospheric component gas in a detectable amount which is greater than the amount of Ta described in the above (ii) and said amount increases as the substrate temperature increases; and (v) the gas partial pressure of each of $H_2O$, $CO_2$, $CH_4$ and $O_2$ in the film-forming chamber increases as the substrate temperature increases and this tendency is significant particularly for the gas partial pressure of $H_2O$.

From the above findings (i) to (v), the following are recognized. That is, the constituent element Ta of the deposition preventive member unavoidably contaminates a formed film; and despite forming the film after the deposition preventive member has been subjected to baking treatment, oxygen and carbon from the atmospheric component gas are contaminate the film formed.

Now, in general, in the film formation by a sputtering process, there is a limit for the substrate temperature to be employed because of the structure of the sputtering apparatus used, particularly the substrate temperature is limited to a maximum of about 600° C. And it is a technical common knowledge that crystal growth of a film formed desirably proceeds at an elevated substrate temperature. However, in the case where the substrate temperature is increased to such a temperature where crystal growth desirably proceeds, the gas partial pressure of each of $H_2O$, $CO_2$, $CH_4$ and $O_2$ increases accordingly, and as a result, the resulting film contains oxygen and carbon respectively in a relatively large amount and contains Ta, the constituent element of the deposition protective member.

In consequence, it is understood that it is almost impossible to obtain a high quality crystalline film which is extremely low in contamination of foreign matters by means of the conventional sputtering apparatus shown in FIG. 4.

EXPERIMENT 2

Figure 3:
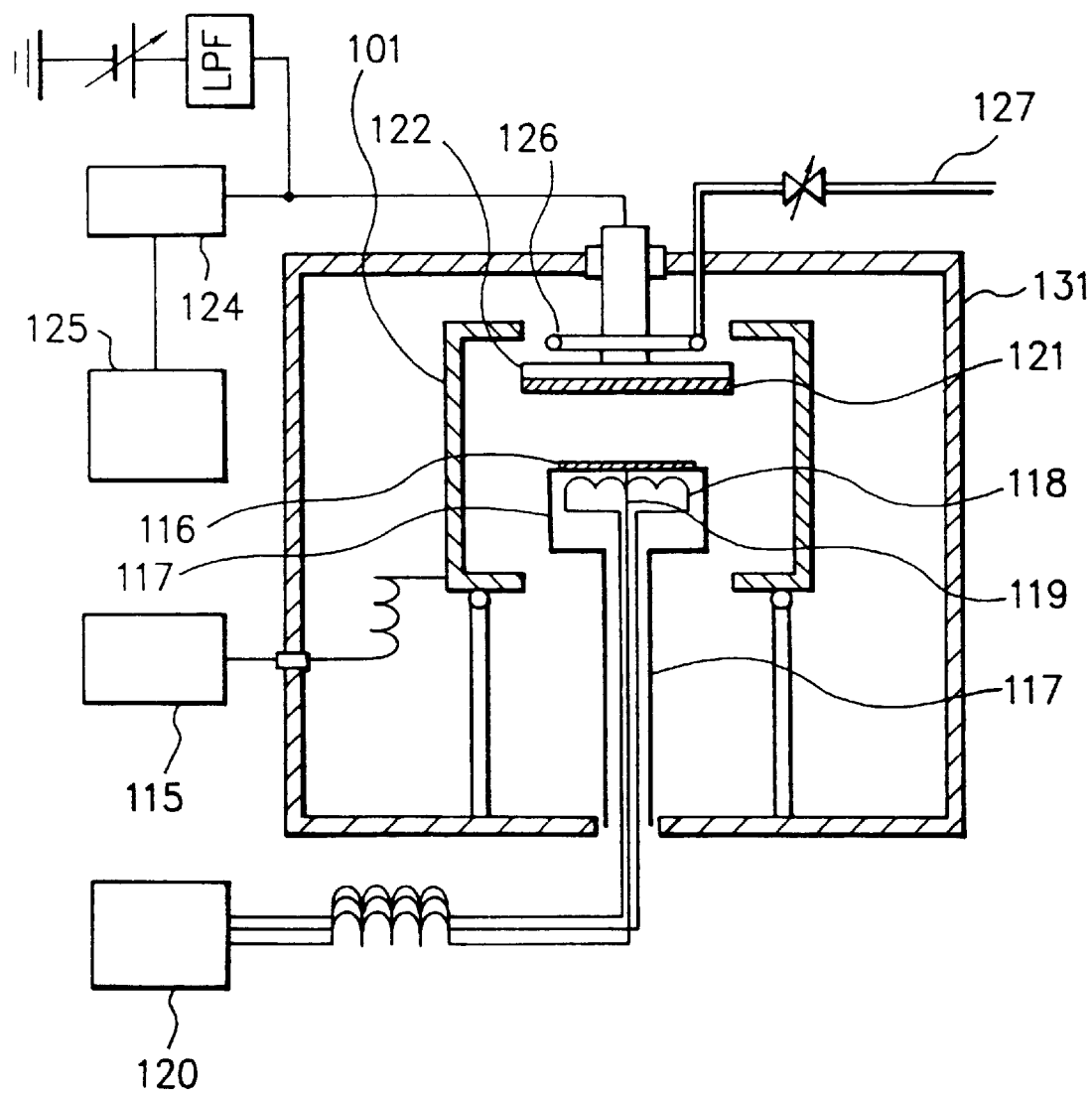
FIG. 3 is a schematic diagram of a sputtering apparatus of the constitution based on the principle described in Literature 2.

In this experiment, there was formed a Si film, using a sputtering apparatus shown in FIG. 3 (which is based on the principle of the process described in Literature 2).

The apparatus shown in FIG. 3 comprises a film-forming chamber 131, and a deposition preventive member 101, a target holder 122 and a substrate holder 117 being disposed in the film-forming chamber. Numeral reference 121 indicates a target which is connected through a matching circuit 124 to a high frequency power source 125. The deposition preventive member 101 is connected to a power source 115 disposed outside the film-forming chamber 131 such that a voltage can be applied to the deposition preventive member 101. The deposition preventive member 101 comprises an oxygen-free copper plate applied with a coat comprising Ta to the surface thereof. The target 121 comprises an n-type FZ (100) Si single crystal plate of $1.8\times10^{18}$ cm$^{-3}$ in P-content and of 4 inches in diameter. Numeral reference 166 indicates a substrate comprising a p-type FZ (100) Si single crystal wafer of $1.0\times10^{15}$ cm$^{-3}$ in B-content and of 2 inches in diameter.

(1) In order to measure Ar ion energy impinged into the deposition preventive member 101, a reflective electrostatic field Faraday cup was arranged at the inner wall face of the deposition protective member 101 to measure ion energy in the following film formation.

Firstly, the film-forming chamber 131 was evacuated to bring the inside to a vacuum of $1\times10^{-7}$ Torr. Then, a heater 118 connected to a power source 120 for heating the substrate was energized to heat the substrate 116 to 300° C. Successively, Ar gas was introduced into the film-forming chamber 131 at a flow rate of 100 sccm through a gas spouting pipe 126 connected to a gas supply pipe 127, followed by switching on the high frequency power source connected to the target 121 to apply a power of 300 W with a frequency of 105 MHz. At this time, a power source of direct current connected to a LPF was switched on to apply a direct current voltage of −70 V. Thus, there was caused plasma in the film-forming chamber 131. Formation of a Si film on the substrate 116 was conducted for 20 minutes while applying a prescribed bias voltage from the power source 115 on the deposition preventive member 101. The inner pressure of the film-forming chamber in this case was controlled to $8\times10^{-3}$ Torr.

The above film formation procedures were repeated with a different bias voltage applied to the deposition preventive member 101 in the range of from −50 V to +50 V. In each case, ion energy impinged into the reflective electrostatic field Faraday cup was measured by a conventional ion energy measuring method. The measured results obtained are graphically shown in FIG. 6(C).

Figure 6A:
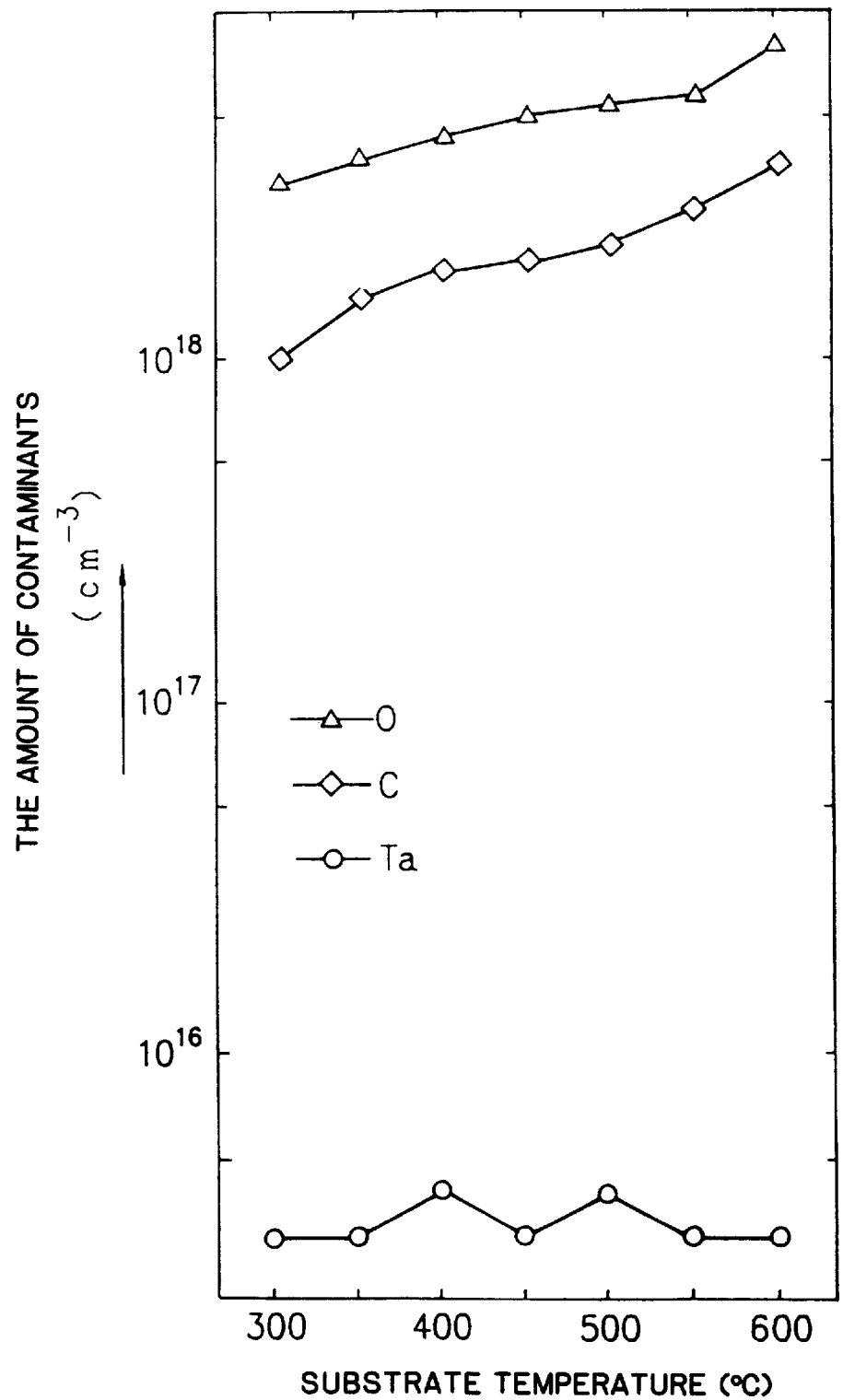
FIG. 6(A) through FIG. 6(D) are graphs respectively showing the results obtained in Experiment 2.
Figure 6B:
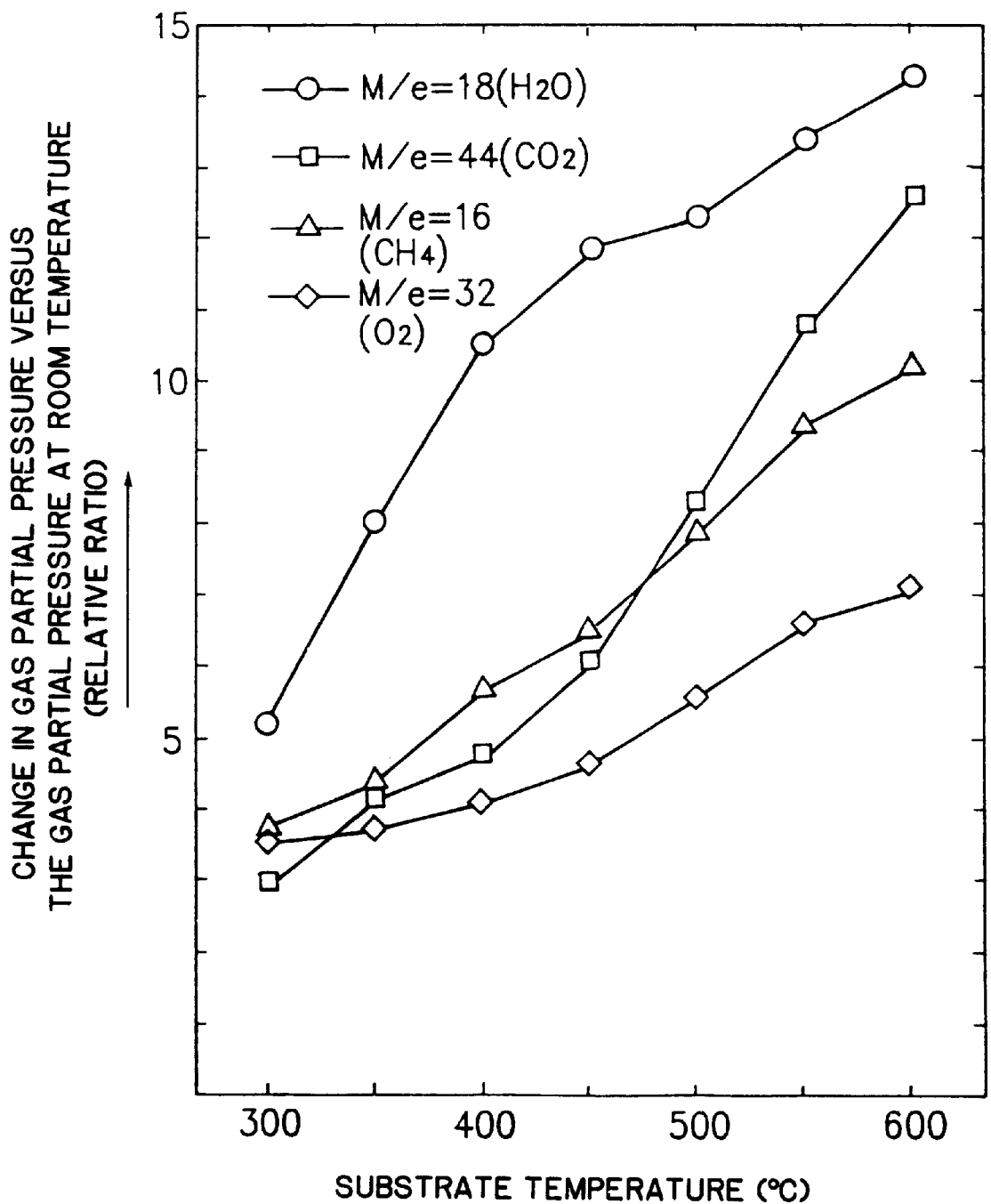
Figure 6C:
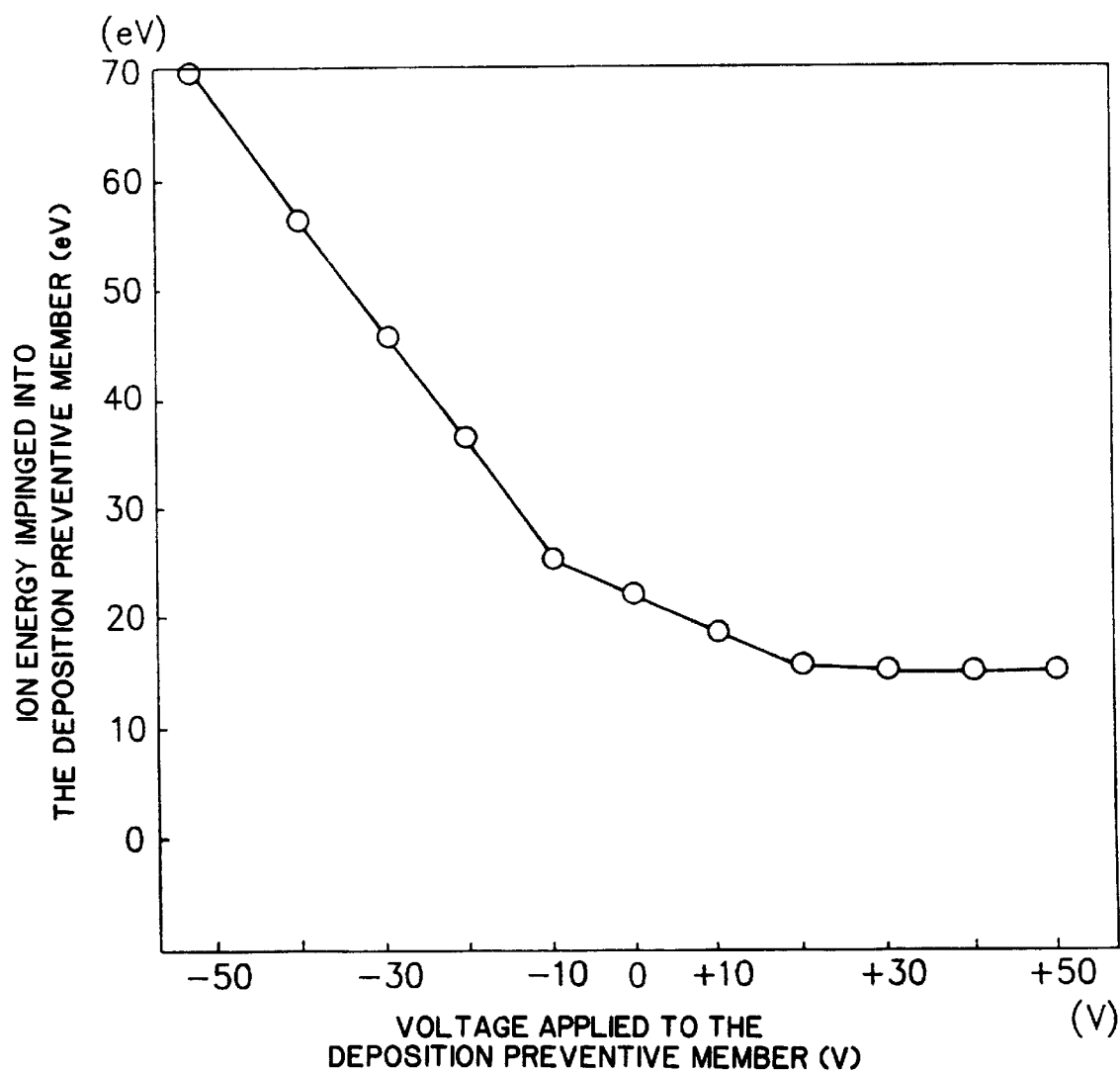

From the results shown in FIG. 6(C), the following are recognized. That is, the quantity of Ar ion energy impinged into the deposition preventive member 101 decreases as the potential of the deposition preventive member 101 increases on the plus side; a turning point is provided for the quantity of Ar ion energy impinged into the deposition preventive member when the potential of the deposition preventive member is +20 V; and the quantity of Ar ion energy impinged into the deposition preventive member thereafter maintains constant even if the potential of the deposition preventive member is beyond the above value.

This indicates that when the potential of the deposition preventive member 101 is +20 V or above, the potential of plasma depends upon the potential of the deposition preventive member 101 and it increases on the plus side together with the potential of the deposition preventive member 101. In this case, that is, when the potential of the deposition preventive member 101 is +20 V or above, a difference between the potential of the substrate 116 and that of plasma generated in the film-forming chamber 131 becomes great, wherein Ar ion of the plasma is impinged to the surface of the substrate 116 with large energy to damage the surface of the substrate 116.

(2) As for each of the films obtained in the above (1), the amount of Ta contaminated into the film was measured by means of the SIMS. The results obtained are graphically shown in FIG. 6(D).

Figure 6D:
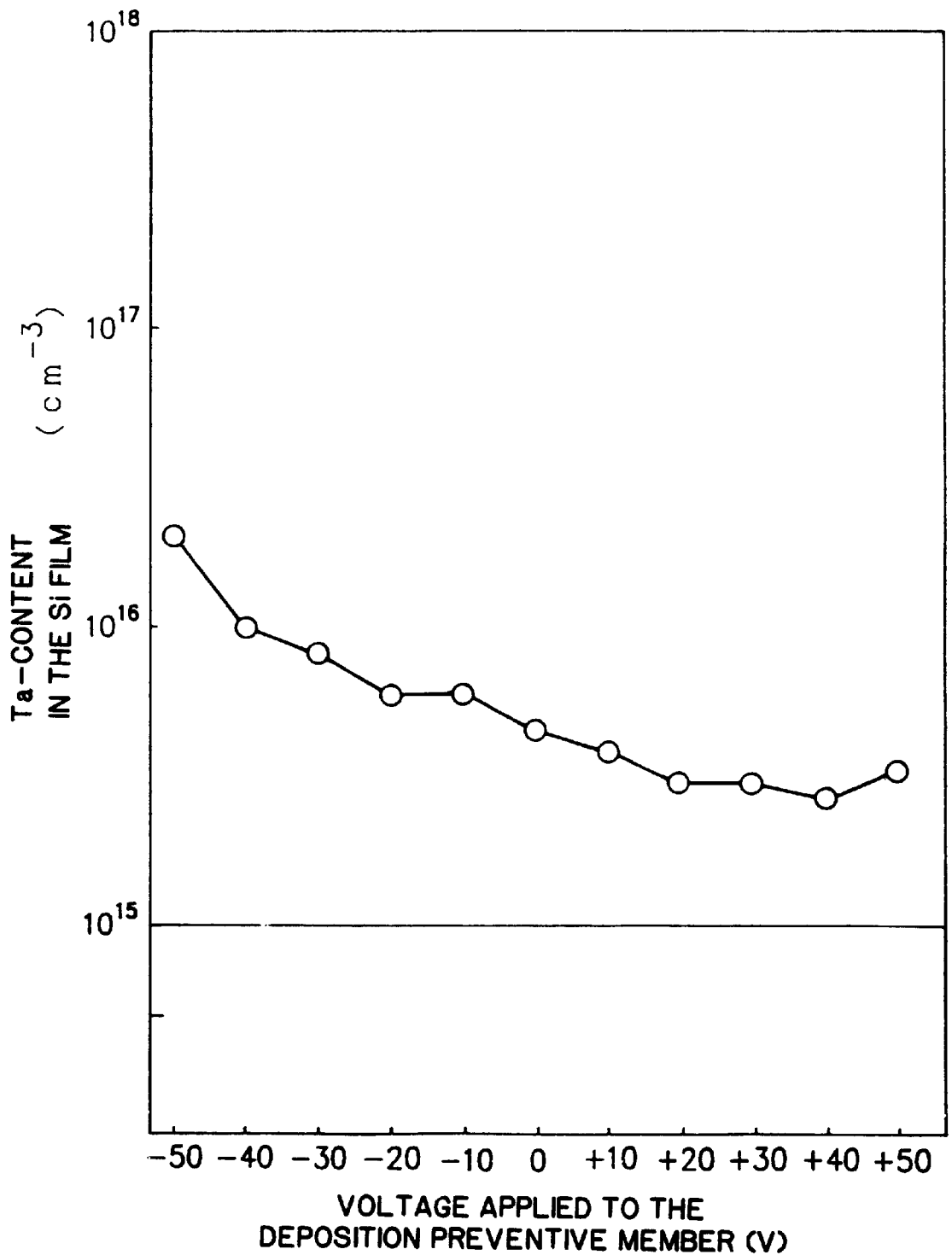

From the results shown in FIG. 6(D), the following is recognized. That is, the amount of Ta contaminated into the Si film is minimized when the potential of the deposition preventive member 101 is +20 V or above.

Combining the findings obtained herein with the above findings obtained from the results shown in FIG. 6(C), it is understood that the potential of the deposition preventive member 101 at which the surface of the substrate 116 does not suffer from damage due to Ar ion and the amount of Ta contaminated into the Si film is lowest is +20 V.

(3) On the basis of the findings obtained in the above (2), the procedures of forming the Si film on the substrate 116 in the above (1) were repeated, wherein the potential of the deposition preventive member was made constant at +20 V. The film formation was performed at the respective substrate temperatures differing one from another at an interval of 50° C. in the range of from 300° C. to 600° C. As for the resultant Si film in each case, the content of each of the contaminants tantalum (Ta), oxygen (O) and carbon (C) was measured by means of the SIMS. And as for each of the resultant Si films, crystal diffraction was performed by RHEED.

The results obtained are collectively shown in Table 2. And, the measured results with respect to the content of each of the contaminants Ta, O and C in the respective Si films are graphically shown in FIG. 6(A).

In addition, in each of the above film formation processes, the gas partial pressure of each of $H_2O$, $CO_2$, $CH_4$ and $O_2$ in the film-forming chamber at room temperature and the respective temperatures in the range of from 300° C. to 600° C. for the substrate temperature was measured by means of the QMA. The results obtained are graphically shown in FIG. 6(B), in which are shown values relative to the measured values at the substrate temperature being room temperature.

The results shown in Table 2, FIG. 6(A), FIG. 6(B), FIG. 6(C) and FIG. 6(D), the following findings are provided.

That is, as apparent from the results shown in FIG. 6(D), when the potential of the deposition preventive member 101 is made to be +20 V or above, the amount of Ta contaminated into the Si film becomes minimum; however, even when film formation is conducted while controlling the potential of the deposition preventive member to +20 V, the resulting film (that is, a Si film) is unavoidably contaminated with O and C originated from the atmospheric component gas. Particularly, in any of the film formation processes at different substrate temperatures in the range of from 300° C. to 600° C., the resulting film in each case is single-crystalline; however, (i) any of the films obtained contains oxygen and carbon originating from the atmospheric component gas in a detectable amount which is greater than those in Experiment 1, (ii) the content of the oxygen and that of the carbon increase as the substrate temperature increases, and (iii) the gas partial pressure of each of $H_2O$, $CO_2$, $CH_4$ and $O_2$ in the film-forming chamber increases as the substrate temperature increases and this tendency of increasing the gas partial pressure of each of these gases is more significant in comparison with that in the case of Experiment 1.

From the above findings, the following are recognized. That is, although the amount of the constituent element Ta of the deposition preventive member to be contaminated into a film formed is reduced, both oxygen and carbon originated from the atmospheric component gas are unavoidably contaminated into the film. Because of this, the resulting film contains oxygen and carbon respectively in a greater amount than those the film in Experiment 1 does.

In consequence, it is understood that it is almost impossible to obtain a high quality crystalline film which is extremely low in contamination of foreign matters by means of the conventional sputtering apparatus shown in FIG. 3.

EXPERIMENT 3

In this experiment, there was used an apparatus comprising the apparatus shown in FIG. 3, which is additionally provided with a heater 103 for the deposition preventive member and a power source 105 for the heater which are disposed in an apparatus shown in FIG. 1 according to the present invention. The latter apparatus will be later described. The reference numerals in FIG. 3 have the same meaning as those in FIG. 1, unless otherwise noted. The apparatus used in this experiment is not shown in the attached drawings.

As for the apparatus used herein, the constituents which are the same as those in the apparatus shown in FIG. 3 are indicated by the corresponding numeral references employed in FIG. 3, and the constituents which are the same as those in the apparatus shown in FIG. 1 are indicated by the corresponding numeral references employed in FIG. 1.

The target 121 and the substrate 116 used herein are the same as those used in Experiment 2.

Film formation in this experiment was conducted as follows. First, the film-forming chamber 131 was evacuated to a vacuum of $1 \times 10^{-7}$ Torr. Then the heater 103 for the deposition preventive member was energized to heat the deposition preventive member 101 to 250° C., and the deposition preventive member was engaged in baking treatment for eight hours while maintaining the deposition preventive member at this temperature. Thereafter, the deposition preventive member was cooled to room temperature. The substrate 116 was then placed on the substrate holder 117 in the film-forming chamber 131. The residual gas in the film-forming chamber 131 was examined by means of the QMA.

The heater 118 was energized to heat the substrate to a predetermined temperature. The residual gas in the film-forming chamber 131 at this time was examined by means of the QMA.

Thereafter, Ar gas was introduced into the film-forming chamber 131 at a flow rate of 100 sccm through the gas spouting pipe 126. The high frequency power source 125 was switched on to apply a power of 300 W with a frequency of 105 MHz to the target. At the same time, the direct current power source connected to the LPF was switched on to apply a voltage of direct current of −70 V. Concurrently, the power source 115 was switched on to apply a bias voltage of +20 V to the deposition preventive member 101. Thus, plasma was caused in the film-forming chamber 131. Formation of a Si film on the substrate 116 was conducted for 20 minutes. The inner pressure of the film-forming chamber in this case was controlled to $8 \times 10^{-3}$ Torr.

The above film-forming procedures were repeated with the respective substrate temperatures differing one from another at an interval of 50° C. in the range of from 300° C. to 600° C. As for the resultant Si film in each case, the content of each of the contaminants Ta, C and O was measured by means of the SIMS. Crystal diffraction was performed by RHEED. The results obtained are collectively shown in Table 3. And, the measured results by means of the QMA with respect to the gas partial pressure of each of the residual gases $H_2O$, $CO_2$, $CH_4$ and $O_2$ are graphically shown in FIG. 7(B). The content of each of the contaminants Ta, C and O for the respective Si films formed respectively at a different substrate temperature shown in Table 3 are graphically shown in FIG. 7(A).

Figure 7A:
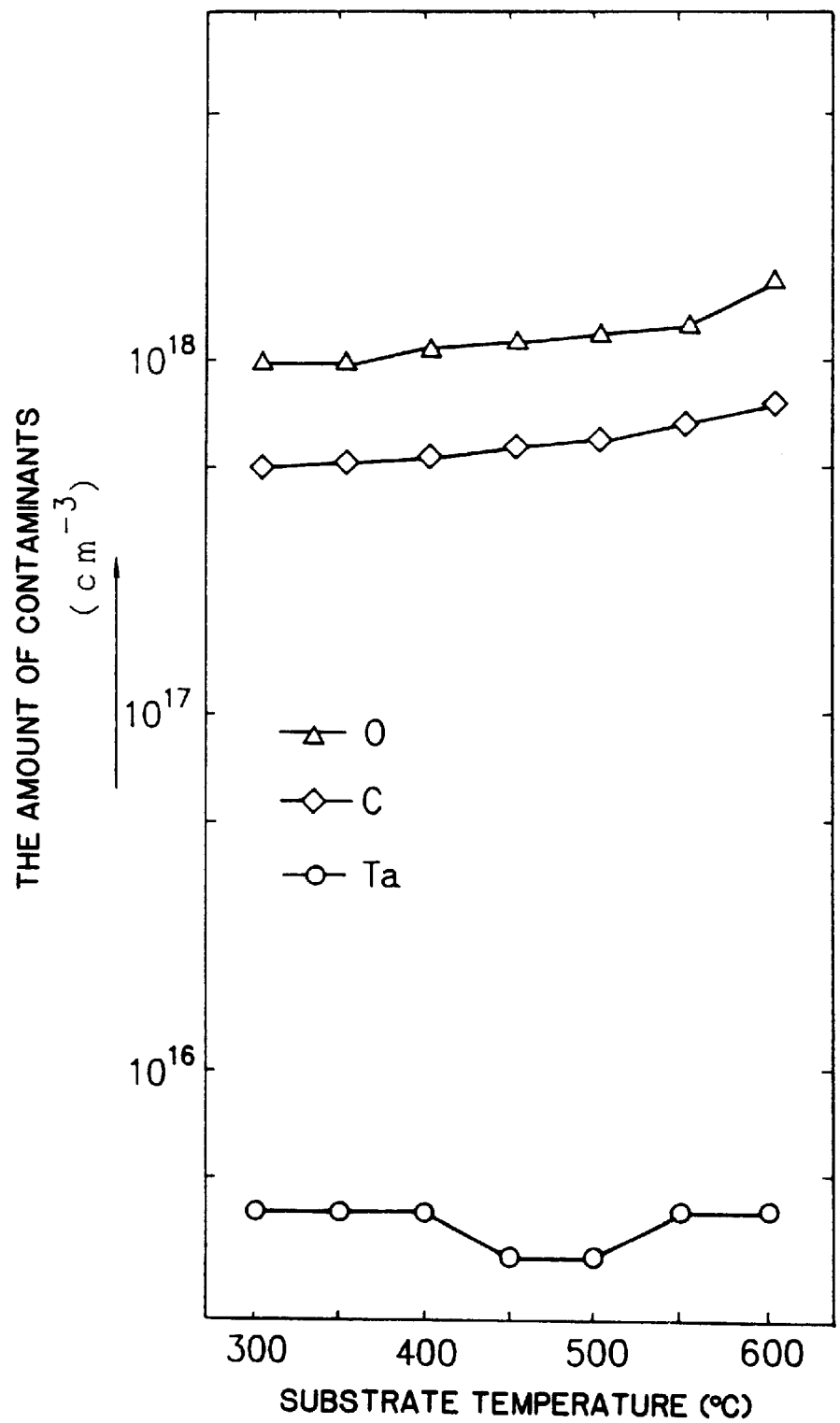
FIG. 7(A) and FIG. 7(B) are graphs respectively showing the results obtained in Experiment 3.
Figure 7B:
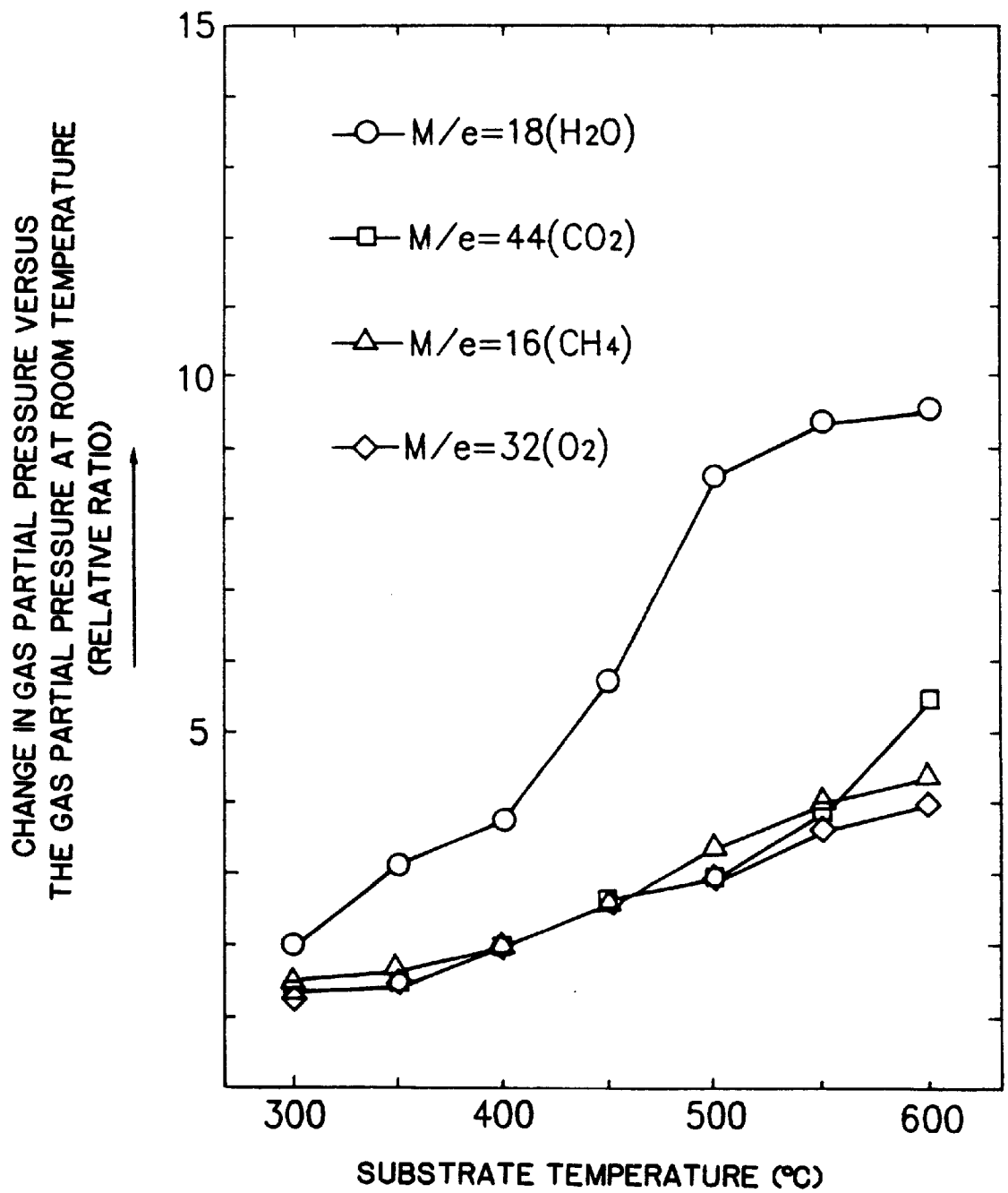

From the results shown in Table 3, FIG. 7(A) and FIG. 7(B), the following findings are provided. That is, compared with the case of Experiment 1, the amount of Ta contaminated into the Si film is lower as well as in the case of Experiment 2, but the amount of each of O and C, which are originated from the atmospheric component gas, contaminated into the film is still distinguishable although it is lower than that in the case of Experiment 2. And, as well as in the case of Experiment 1, the gas partial pressure of each of $H_2O$, $CO_2$, $CH_4$ and $O_2$ increases at a substrate temperature at which crystal growth desirably proceeds, wherein the resulting film contains both oxygen and carbon respectively in a relatively large amount and also contains the constituent element Ta of the deposition preventive member. Thus, although there can be obtained a film which is superior to those films obtained in Experiments 1 and 2 in terms of content of contaminants, it still difficult to obtain a high quality crystalline film which is extremely low in contaminants.

From the results obtained in Experiments 1 to 3, the following are recognized. That is, the gas partial pressure of each of $H_2O$, $CO_2$, $CH_4$ and $O_2$ from the atmospheric component gas increases at a temperature at which crystal growth desirably proceeds, wherein the resulting film contains oxygen and carbon respectively in a relatively large amount. It is almost impossible to obtain a high quality crystalline film which is extremely low in content of contaminants by the sputtering process using the deposition preventive member in the film-forming chamber in any of 1) (Experiment 1) wherein the deposition preventive member is subjected to baking treatment in advance of the film formation, 2) the case (Experiment 2) wherein a prescribed bias voltage is applied to the deposition preventive member during the film formation, and 3) the case (Experiment 3) wherein the deposition preventive member is subjected to baking treatment in advance of the film formation and a prescribed bias voltage is applied to the deposition preventive member during the film formation.

EXPERIMENT 4

In this experiment, a sputtering apparatus of the constitution shown in FIG. 1 is provided with a deposition preventive member, a means for subjecting the deposition preventive member to baking treatment, a means for applying a prescribed bias voltage to the deposition preventive member, and a means for cooling the deposition preventive member. The apparatus shown in FIG. 1 is characterized by comprising a deposition preventive member 101 provided with a cooling pipe 106 as the cooling means, a cooling medium supply pipe 107A, a cooling medium exhaust pipe 107B, and a chiller unit 109. This apparatus is an embodiment of the apparatus according to the present invention.

In the following, description will be made of the apparatus shown in FIG. 1.

Numeral reference 131 indicates a film-forming chamber which is electrically grounded. A target holder 122 is disposed at the upper wall portion of the film-forming chamber 131 through an insulating member. The target holder 122 comprises a main body provided with a target supporting member. Numeral reference 121 indicates a target fixed to the surface of the target supporting member. The main body is connected to a power source 125 for plasma discharge through a matching circuit 124.

In the inside of the film-forming chamber 131, there is disposed a substrate holder 117 provided with a substrate supporting member 117A serving to support a substrate 116 placed thereon. The substrate holder is electrically connected to the film-forming chamber 131, and it is arranged to be opposite to the target holder 122. The substrate holder 117 and the film-forming chamber 131 are designed to be of an equivalent potential. The substrate supporting member 117A is equipped with a heater 118 and a thermocouple 119 therein. The heater 118 and the thermocouple 119 are connected to a power source 120 for heating the substrate, which is disposed outside the film-forming chamber 131. The target holder 122 and the substrate holder 117 establish a pair of electrodes. In the inside of the film-forming chamber 131, a cooling medium supply pipe 107A and a cooling medium exhaust pipe 107B are disposed such that they can move upwards and downwards through respective bellows seal members 110. The cooling medium supply pipe 107A and the cooling medium exhaust pipe 107B are piped such that their end portion horizontally extends. Particularly, their horizontally piped portion is made such that it contacts with the exterior of the lower wall portion of the deposition preventive member 101 by which the plasma generation region containing the space between the target 121 and the substrate 116 is circumscribed. The upper and lower walls of the deposition preventive member 101 are opened in order to prevent the target holder 122 and the substrate holder 117 from interfering with each other upon moving the deposition preventive member 101 upwards and downwards. A heater 103 as a heating means is disposed at the exterior of the deposition preventive member 101 so as to surround the deposition preventive member 101. The heater 103 is connected to a power source 105 disposed outside the film-forming chamber 131. Numeral reference 106 indicates a cooling pipe, which is arranged along the exterior of the deposition preventive member 101 such that it does not overlap the heater 103. Opposite ends of the cooling pipe 106 are designed such that they are situated at the bottom exterior of the deposition preventive member 101 and that they are connected respectively to the cooling medium supply pipe 107A and the cooling medium exhaust pipe 107B.

The cooling medium supply pipe 107A and the cooling medium exhaust pipe 107B are connected to a chiller unit 109 disposed outside the film-forming chamber 131. A cooling medium such as water maintained at a prescribed temperature from the chiller unit 109 is circulated through the cooling medium supply pipe 107A and the cooling medium exhaust pipe 107B. By this, the deposition preventive member 101 is cooled. Each of the cooling medium supply pipe 107A and the cooling medium exhaust pipe 107B is equipped with an insulating coupling 108 as an insulating means. By this, the deposition preventive member 101 is electrically isolated from other members.

Numeral reference 127 indicates a gas supply pipe provided with a valve capable of adjusting the flow rate of a gas supplied. A gas spouting pipe 126 is connected to the gas supply pipe. The gas spouting pipe 126 comprises a circular pipe provided with a plurality of gas liberation holes (not shown).

Sputtering gas such as Ar gas from a gas reservoir is fed through the gas supply pipe 127 and is spouted into the plasma treating region including the space between the target 121 and the substrate 116 through said plurality of gas liberation holes.

An exhaust system (not shown) is connected to the film-forming chamber 131. The exhaust system includes an exhaust port 130 provided with a gas exhaustion adjusting valve. The inside of the film-forming chamber 131 is evacuated through the exhaust port. The film-forming chamber 131 is connected to a load lock chamber 132 through a gate valve. In order to make it possible to independently evacuate the load lock chamber 132 and the film-forming chamber 131 one from another, the load lock chamber 132 is provided with an independent exhaust system (not shown) including an exhaust port 135. The load lock chamber contains a substrate transportating instrument 134. The substrate transporting instrument 134 serves to transport the substrate 116.

At the position below the film-forming chamber 131, the cooling medium supply pipe 107A and the cooling medium exhaust pipe 107B are connected to a driving motor 112. The driving motor 112 is provided with a rotary shaft. Numeral reference indicates a pinion 112A fixed to the rotary shaft. The pinion 112A is disposed so as to nest into engagement with a rack 113A formed at a support member 113 connected to the bottom wall of the film-forming chamber 131. The deposition preventive member 101, which is supported by the cooling medium supply pipe 107A and the cooling medium exhaust pipe 107B, is designed so as to move up and down by virtue of the actions of the pinion 112A and the rack 113A caused upon driving the driving motor 112.

In this experiment, as well as in the case of Experiment 1, 2 or 3, the deposition preventive member 101 was constituted by a copper member applied with a Ta coat to the surface thereof.

As the target 121, there was used an n-type FZ (100) single crystal Si plate of $1.8 \times 10^{18}$ cm$^{-3}$ in P-content and 4 inches in diameter. As the substrate 116, there was used a p-type FZ (100) single crystal Si wafer of $1.0 \times 10^{15}$ cm$^{-3}$ in B-content and 2 inches in diameter.

In the following, the film-forming procedures used in this experiment will be described, the examination of a Si film obtained, and the evaluation of said film.

The film-forming chamber 131 was first evacuated to a vacuum of $1 \times 10^{-8}$ Torr by actuating the exhaust device connected to the exhaust port 130. The deposition preventive member 101 was subjected to baking treatment by heating it to 250° C. and maintaining it at this temperature for 8 hours, by energizing the heater 103.

Then, the substrate 116 was positioned on the substrate transporting instrument 134 of the load lock chamber 132, followed by evacuating the load lock chamber 132 to a vacuum of $1 \times 10^{-7}$ Torr by means of the load lock chamber exhausting system (not shown). Thereafter, the gate valve was opened, and the substrate transporting instrument 134 having the substrate 116 thereon was moved into the film-forming chamber 131, whereby the substrate 116 was positioned on the substrate support member 117A. The substrate transporting instrument 134 was then returned to the load lock chamber 132, and thereafter, the gate valve was closed. Water as the cooling medium was circulated within the cooling pipe 106 through the cooling medium supply pipe 107A and the cooling medium exhaust pipe 107B by operating the chiller unit 109, to thereby cool the deposition preventive member 101. At this time, the residual gas in the film-forming chamber 131 was measured by means of the QMA.

Then, Ar gas was introduced into the film-forming chamber 131 at a flow rate of 100 sccm through the gas spouting pipe 126. The power source 115 for the deposition preventive member was switched on to apply a direct current voltage of +20 V to the deposition preventive member 101. At the same time, the power source 125 was switched on to apply a high frequency power of 300 W with a frequency of 105 MHz to the target holder 122. Further, the direct current power source connected to the LPF was switched on to apply a direct current voltage of −70 V. By this, plasma was generated between the target 121 and the substrate 116, whereby the formation of a Si film was caused on the substrate 116. During the film formation, the deposition preventive member was maintained at about 25° C.

The above film-forming procedures were repeated while maintaining the substrate 116 at temperatures differing one from another at an interval of 50° C. in the range of 300° C. to 600° C.

As for the resultant Si film, in each case the content of each of the contaminants Ta, C and O was measured by means of the SIMS. Crystal diffraction was performed by RHEED. The results obtained are collectively shown in Table 4.

Figure 8A:
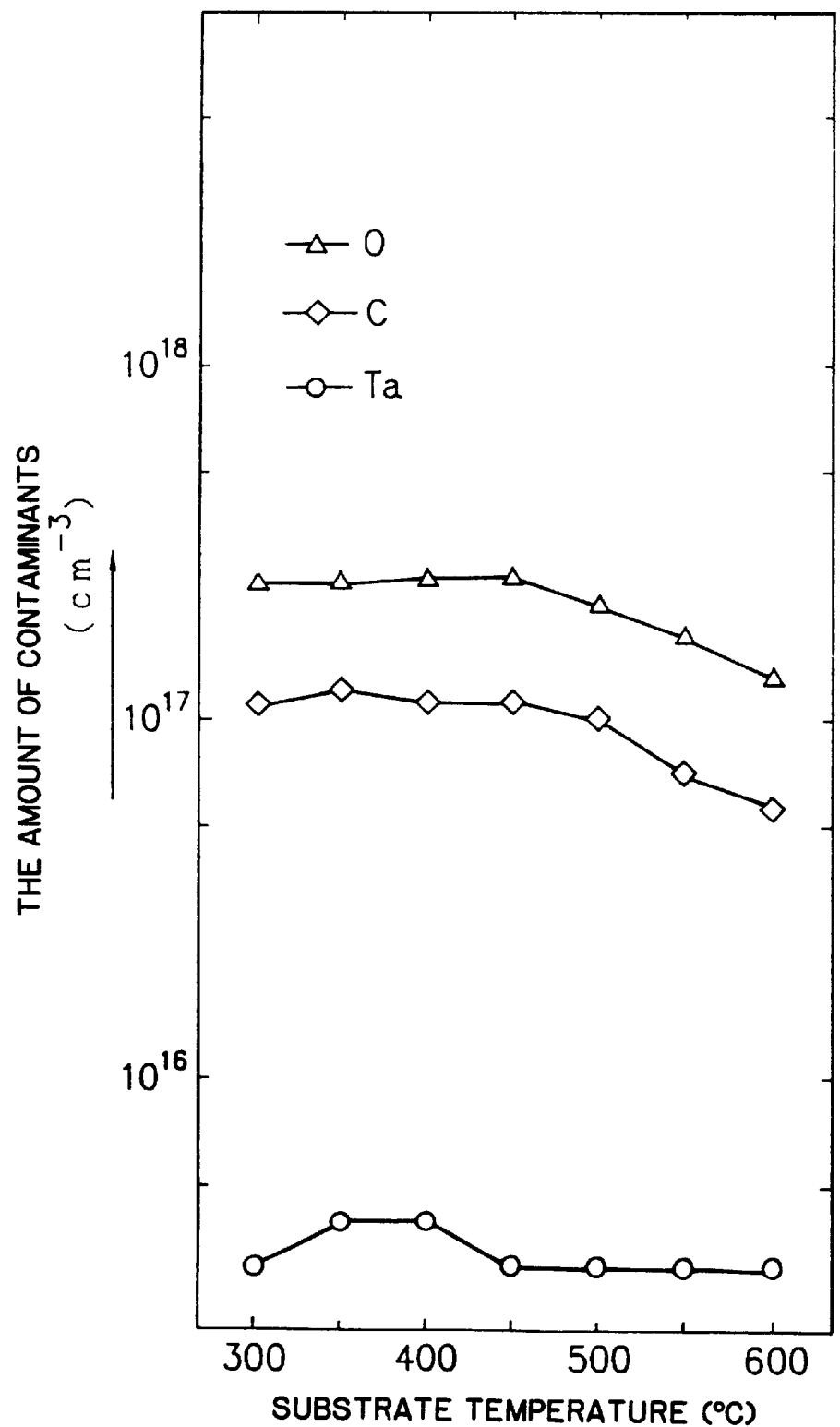
FIG. 8(A) and FIG. 8(B) are graphs respectively showing the results obtained in Experiment 4.
Figure 8B:
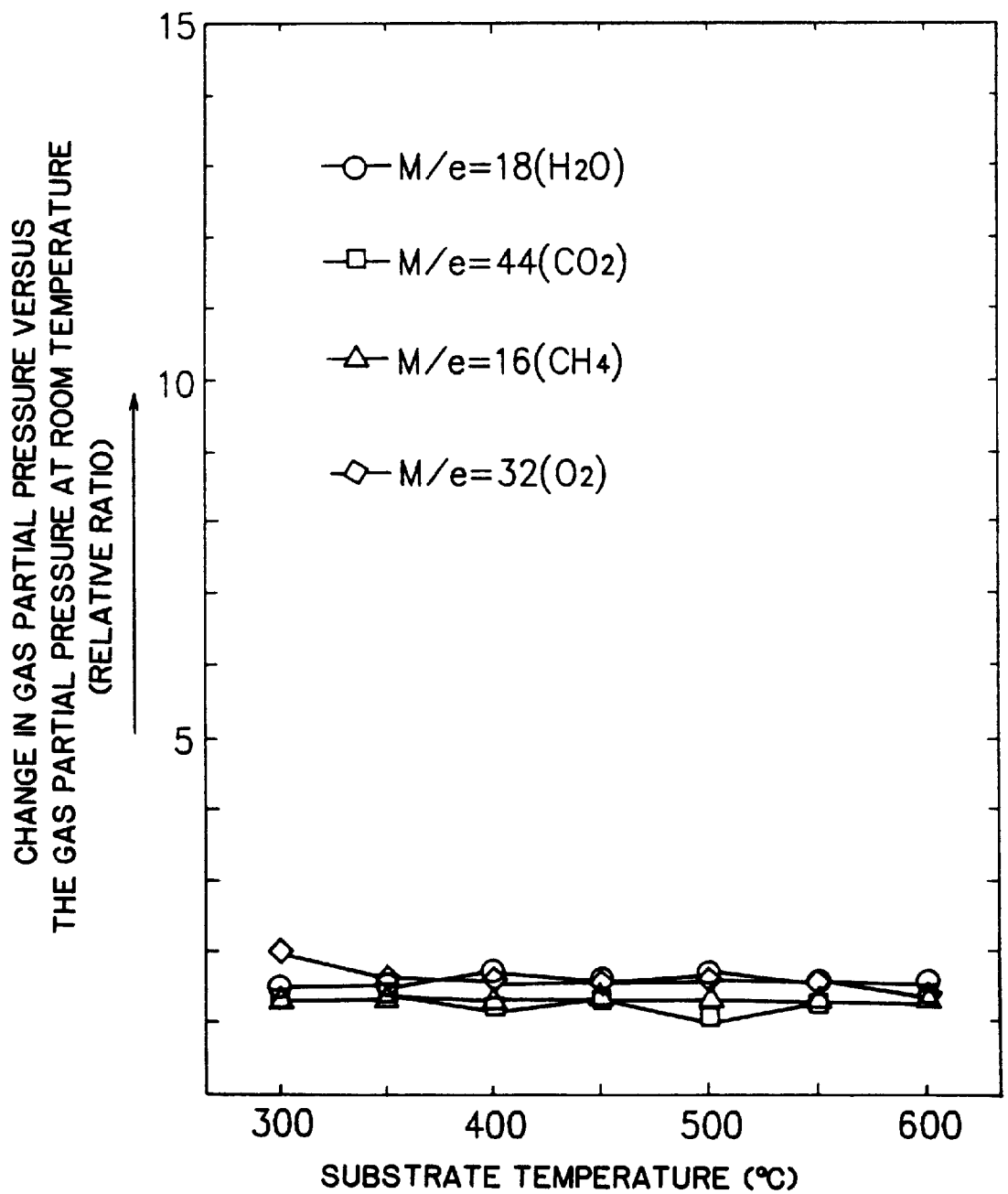

The measured results of the residual gas by means of the QMA in the above, particularly the measured results of the partial gas pressure of each of $H_2O$, $CO_2$, $CH_4$ and $O_2$, are collectively, graphically shown in FIG. 8(B). The measured results shown in Table 4 with respect to the content of each of the contaminants Ta, C and O for the respective Si films formed respectively at a different substrate temperature are graphically shown in FIG. 8(A).

From the results shown in Table 4, FIG. 8(A) and FIG. 8(B), the following findings are provided. In the film formation by sputtering process in this experiment wherein a deposition preventive member is disposed in the film-forming chamber, the deposition preventive member is subjected to baking treatment prior to commencing the film formation, and the deposition preventive member is maintained at a predetermined temperature by cooling it while applying a predetermined voltage to the deposition preventive member during the film formation, the amount of contaminants incorporated into a Si film formed is desirably low as well as in the case of Experiment 2 or 3; the contamination of O and C originated from the atmospheric component gas is markedly smaller than that in the case of Experiment 1, 2 or 3; and at a high substrate temperature where crystal growth effectively proceeds, the partial gas pressure of each of $H_2O$, $CO_2$, $CH_4$ and $O_2$ is extremely low, and there is obtained a high quality crystalline film with a remarkably slight contamination with respect to any of O and C and which is extremely low in contamination of Ta. Especially, as the substrate temperature is increased, the amount of each of O and C contaminates in a film is decreased, being distinguishably different from the case of Experiment 1, 2 or 3. This situation is apparent with reference to FIG. 8(A) and FIG. 8(B).

In consequence, it is understood that according to the sputtering film-forming apparatus of the present invention, which is shown in FIG. 1, it is possible to obtain a high quality crystalline film which is extremely low in foreign contaminants.

TABLE 1

| SUBSTRATE TEMPERATURE | 300° C. | 350° C. | 400° C. | 450° C. | 500° C. | 550° C. | 600° C. |
|---|---|---|---|---|---|---|---|
| Ta CONTENT ($cm^{-3}$) | $5 \times 10^{15}$ | $6 \times 10^{15}$ | $5 \times 10^{15}$ | $5 \times 10^{15}$ | $6 \times 10^{15}$ | $6 \times 10^{15}$ | $7 \times 10^{15}$ |
| O CONTENT ($cm^{-3}$) | $1.0 \times 10^{18}$ | $1.0 \times 10^{18}$ | $1.1 \times 10^{18}$ | $1.2 \times 10^{18}$ | $1.3 \times 10^{18}$ | $1.7 \times 10^{18}$ | $2.0 \times 10^{18}$ |
| C CONTENT ($cm^{-3}$) | $5.8 \times 10^{17}$ | $6.6 \times 10^{17}$ | $7.3 \times 10^{17}$ | $8.0 \times 10^{17}$ | $8.5 \times 10^{17}$ | $1.1 \times 10^{18}$ | $1.5 \times 10^{18}$ |
| ELECTRON DIFFRACTION | KIKUCHI LINE | KIKUCHI LINE | KIKUCHI LINE | KIKUCHI LINE | KIKUCHI LINE | KIKUCHI LINE | KIKUCHI LINE |

TABLE 2

| SUBSTRATE TEMPERATURE | 300° C. | 350° C. | 400° C. | 450° C. | 500° C. | 550° C. | 600° C. |
|---|---|---|---|---|---|---|---|
| Ta CONTENT ($cm^{-3}$) | $3 \times 10^{15}$ | $3 \times 10^{15}$ | $4 \times 10^{15}$ | $3 \times 10^{15}$ | $4 \times 10^{15}$ | $3 \times 10^{15}$ | $3 \times 10^{15}$ |
| O CONTENT ($cm^{-3}$) | $3.2 \times 10^{18}$ | $3.8 \times 10^{18}$ | $4.4 \times 10^{18}$ | $5.0 \times 10^{18}$ | $5.4 \times 10^{18}$ | $5.7 \times 10^{18}$ | $8.0 \times 10^{18}$ |
| C CONTENT ($cm^{-3}$) | $1.0 \times 10^{18}$ | $1.5 \times 10^{18}$ | $1.8 \times 10^{18}$ | $1.9 \times 10^{18}$ | $2.1 \times 10^{18}$ | $2.7 \times 10^{18}$ | $3.6 \times 10^{18}$ |
| ELECTRON DIFFRACTION | KIKUCHI LINE | KIKUCHI LINE | KIKUCHI LINE | KIKUCHI LINE | KIKUCHI LINE | KIKUCHI LINE | KIKUCHI LINE |

TABLE 3

| SUBSTRATE TEMPERATURE | 300° C. | 350° C. | 400° C. | 450° C. | 500° C. | 550° C. | 600° C. |
|---|---|---|---|---|---|---|---|
| Ta CONTENT ($cm^{-3}$) | $4 \times 10^{15}$ | $4 \times 10^{15}$ | $4 \times 10^{15}$ | $3 \times 10^{15}$ | $3 \times 10^{15}$ | $4 \times 10^{15}$ | $4 \times 10^{15}$ |
| O CONTENT ($cm^{-3}$) | $1.0 \times 10^{18}$ | $1.0 \times 10^{18}$ | $1.1 \times 10^{18}$ | $1.2 \times 10^{18}$ | $1.3 \times 10^{18}$ | $1.4 \times 10^{18}$ | $1.7 \times 10^{18}$ |
| C CONTENT ($cm^{-3}$) | $5.0 \times 10^{17}$ | $5.2 \times 10^{17}$ | $5.3 \times 10^{17}$ | $5.8 \times 10^{17}$ | $6.0 \times 10^{17}$ | $6.8 \times 10^{17}$ | $7.7 \times 10^{17}$ |
| ELECTRON DIFFRACTION | KIKUCHI LINE | KIKUCHI LINE | KIKUCHI LINE | KIKUCHI LINE | KIKUCHI LINE | KIKUCHI LINE | KIKUCHI LINE |

TABLE 4

| SUBSTRATE TEMPERATURE | 300° C. | 350° C. | 400° C. | 450° C. | 500° C. | 550° C. | 600° C. |
|---|---|---|---|---|---|---|---|
| Ta CONTENT ($cm^{-3}$) | $3 \times 10^{15}$ | $4 \times 10^{15}$ | $4 \times 10^{15}$ | $3 \times 10^{15}$ | $3 \times 10^{15}$ | $3 \times 10^{15}$ | $3 \times 10^{15}$ |
| O CONTENT ($cm^{-3}$) | $2.4 \times 10^{17}$ | $2.4 \times 10^{17}$ | $2.5 \times 10^{17}$ | $2.5 \times 10^{17}$ | $2.1 \times 10^{17}$ | $1.7 \times 10^{17}$ | $1.3 \times 10^{17}$ |
| C CONTENT ($cm^{-3}$) | $1.1 \times 10^{17}$ | $1.2 \times 10^{17}$ | $1.1 \times 10^{17}$ | $1.1 \times 10^{17}$ | $1.0 \times 10^{17}$ | $7.0 \times 10^{16}$ | $5.6 \times 10^{16}$ |
| ELECTRON DIFFRACTION | KIKUCHI LINE | KIKUCHI LINE | KIKUCHI LINE | KIKUCHI LINE | KIKUCHI LINE | KIKUCHI LINE | KIKUCHI LINE |

DESCRIPTION OF THE PREFERRED EMBODIMENTS

The present invention has been accomplished based on the findings obtained in the foregoing experiments.

The present invention includes an improved film-forming method by sputtering process and a film-forming apparatus by sputtering process which is suitable for practicing said film-forming method.

The present invention makes it possible to perform film formation in an extremely clean atmosphere wherein the partial gas pressure of each of $H_2O$, $CO_2$, $CH_4$ and $O_2$ originated from the atmospheric component gas and at a relatively high substrate temperature where crystal growth desirably proceeds. Although a deposition preventive member is used, there is an extremely slight occasion for the constituent material of the deposition preventive member to be sputtered to release its constituent elements, resulting in contaminating a film formed. In other words, there is established a film-forming atmosphere that effectively prevents contaminants such as O, C and the like from the atmospheric component gas from contaminating a film formed and foreign matters liable to contaminate a film formed are rarely released from the deposition preventive member. As a result, crystal growth proceeds in a desirable state to cause the formation of a high quality crystalline semiconductor film which is extremely low in contaminants from the atmospheric component gas and foreign matters originated from the deposition preventive member.

Thus, the present invention is markedly effective in the preparation of a high performance semiconductor device of a multi-layered structure. Particularly, the present invention makes it possible to effectively form a high quality crystalline thin film not only on a crystalline substrate but also on a crystalline thin film with a good reproducibility. In addition, in the case of forming a multi-layered structure, the interfacial state between the adjacent thin films of the multi-layered structure becomes extremely desirable, and a desired dopant profile can be effectively attained.

The film-forming method according to the present invention, which provides these various effects, is characterized by comprising: arranging a deposition preventive member in a film-forming chamber by sputtering process so as to circumscribe a plasma generation region in said film-forming chamber; subjecting said deposition preventive member to heat treatment (baking treatment) prior to commencing film formation, whereby atmospheric component gas adsorbed at said deposition preventive member is released and removed; and performing film formation while applying a bias voltage to said deposition preventive member to prevent charge particles (particularly, ions) of plasma generated in said plasma generation region from sputtering said deposition preventive member and concurrently, while cooling said deposition preventive member to prevent atmospheric component gas adsorbed not only at said deposition preventive member but also at the internal constituent members of said film-forming chamber from releasing therefrom.

More particularly, the film-forming sputtering method according to the present invention comprises sputtering a target for film formation disposed in a film-forming chamber with plasma generated using a sputtering gas to cause the formation of a desired, deposited film on a prescribed substrate, characterized by comprising: arranging a deposition preventive member so as to circumscribe a plasma generation region of said film-forming chamber wherein said plasma is generated; subjecting said deposition preventive member to heat treatment prior to commencing the film formation; and performing the film formation while applying a predetermined bias voltage to said deposition preventive member and concurrently, while cooling said deposition preventive member.

The deposition preventive member used in the present invention is composed of a material which does not release gas therefrom under a vacuum atmosphere, is hardly deformed under a film-forming atmosphere, does not cause chemical reaction and is resistant to conductive, and which is sputtering and has a good thermal conductivity. As such material, there can be illustrated, for example, metals such SUS, Cu, Al, Ta, etc. The deposition preventive member may be of a single-layered structure or a multi-layered structure. In the case where the deposition preventive member is of a multi-layered structure, it may comprise a member comprising the above metal laminated with or applied with an appropriate material to the surface of said member. Such material can include Pt, Ta, W and the like which are hardly sputtered.

An appropriate heating means can be employed in order to subject the deposition preventive member to heat treatment in the present invention. Such heating means can include sheath heater, tungsten wire, and the like which are capable of directly heating the deposition preventive member.

The deposition preventive member in the present invention may be cooled by flowing an appropriate cooling medium through a proper cooling means. Such cooling medium can include water, freon, oil, chilled air, and the like. Among these cooling mediums, water is the most desirable in view of maintaining the inside of the film-forming chamber in a desirably clean state and in view of ease in handling.

In the present invention, the deposition preventive member is preferably maintained at a temperature of less than 50° C., or more preferably at about 25° C. or below upon film formation by cooling the deposition preventive member in the manner above described.

As for the bias voltage applied to the deposition preventive member upon film formation in the present invention, a voltage of direct current is desirable. The voltage applied is such that charge particles (particularly, ions) of plasma generated in the plasma generation region do not sputter the deposition preventive member. The value of the voltage applied cannot be generalized since it somewhat differs depending upon the factors relative to the apparatus used such as the constitution of the apparatus, the volume of the plasma generation region and the like and also depending upon the film-forming conditions employed. However, in general, it can be properly determined based on the value of a voltage applied by which the amount of contaminants incorporated into a formed film becomes constant. For instance, as described in the foregoing Experiment 2, an employable range of the voltage applied can be determined based on the value of +20. In this case, the voltage applied is desired to be of a value in the range of from +10 V to +30 V.

As for the substrate temperature upon film formation in the present invention, as clarified in the foregoing Experiment 4, it is desired to be a temperature corresponding to the turning point (the substrate temperature) from which the amount of contaminants incorporated into a formed film tends to decrease or a higher temperature than that temperature. Specifically, it is desired to be in the range of from 450° C. to 600° C. However, in general, it is technically difficult for the substrate temperature to be an elevated temperature of about 600° C. because of the restriction for the constitution of the sputtering apparatus. The substrate temperature upon film formation is desired to be in the range of from 450° C. to 550° C.

As for the inner pressure of the film-forming chamber upon film formation in the present invention, it can be properly determined in the range at which discharge is desirably caused. However, in a preferred embodiment, it is determined in the range of from 1 mTorr to 50 mTorr.

As the sputtering gas to be introduced into the film-forming chamber upon film formation in the present invention, there can be illustrated inert gases such as Ar gas, He gas, Ne gas, Xe gas, Rn gas, etc. Among these gases, Ar gas is the most desirable.

As the target used upon film formation in the present invention, there can be used any of the conventional targets which are used in the formation of semiconductor films such as Si film, Ge film, etc. respectively of single crystal, polycrystal, or the like, or of metal films such as Al film, Mo film, etc. by sputtering process.

As the substrate used in the case of forming a crystalline film of single crystal or polycrystal in the present invention, any of the conventional substrates used in the formation of the above-mentioned films can be selectively used.

The above-described film-forming sputtering method according to the present invention may be practiced using an appropriate sputtering apparatus which is capable of practicing said film-forming method. The sputtering apparatus is, however, required to comprise a film-forming chamber, a pair of electrodes serving to cause plasma discharge in the film-forming chamber, and a deposition preventive member disposed so as to circumscribe a plasma generation region including the space between said pair of electrodes; said deposition preventive member being capable of preventing particles sputtered from a target serving as one of said pair of electrodes from depositing on the inner wall face of the film-forming chamber; at least a portion of said deposition preventive member to be exposed to plasma generated in said plasma generation region being composed of an electroconductive material; said deposition preventive member being provided with a heating means for heating said deposition preventive member and a cooling means for cooling said deposition preventive member; and said electroconductive portion of said deposition preventive member being electrically connected to a potential controlling means disposed outside the film-forming chamber.

As a typical embodiment of the sputtering apparatus having such constitution as above described, there can be mentioned the apparatus of the constitution shown in FIG. 1 which has been described in the foregoing Experiment 4.

Herein, description will be again made of the sputtering apparatus having the constitution shown in FIG. 1. Numeral reference 131 indicates a film-forming chamber which is electrically grounded. In the film-forming chamber 131, a target holder 122 is disposed through an insulating member. The target holder 122 comprises a main body provided with a target supporting member. Numeral reference 121 indicates a target fixed to the surface of the target supporting member. The main body is connected to a power source 125 for plasma discharge through a matching circuit 124.

In the inside of the film-forming chamber 131, there is disposed a substrate holder 117 provided with a substrate supporting member 117A serving to support a substrate 116 placed thereon. The substrate holder is electrically connected to the film-forming chamber 131, and it is arranged to be opposite to the target holder 122. The substrate holder 117 and the film-forming chamber 131 are designed so as to be of an equivalent potential. The substrate supporting member 117A is equipped with a heater 118 and a thermocouple 119 therein. The heater 118 and the thermocouple 119 are connected to a power source 120 for heating the substrate, which is disposed outside the film-forming chamber 131. The target holder 122 and the substrate holder 117 establish a pair of electrodes. In the inside of the film-forming chamber 131, a cooling medium supply pipe 107A and a cooling medium exhaust pipe 107B are disposed such that they can move upwards and downwards through respective bellows seal members 110. The cooling medium supply pipe 107A and the cooling medium exhaust pipe 107B are piped such that their end portion horizontally extends. Particularly, their horizontally piped portion is made such that it contacts with the exterior of the lower wall portion of the deposition preventive member 101 by which the plasma generation region containing the space between the target 121 and the substrate 116 is circumscribed. The upper and lower walls of the deposition preventive member 101 are opened in order to prevent the target holder 122 and the substrate holder 117 from interfering with each other upon moving the deposition preventive member 101 upwards and downwards. A heater 103 as a heating means is disposed at the exterior of the deposition preventive member 101 so as to surround the deposition preventive member 101. The heater 103 is connected to a power source 105 disposed outside the film-forming chamber 131. Numeral reference 106 indicates a cooling pipe, which is arranged along the exterior of the deposition preventive member 101 such that it does not overlap over the heater 103. Opposite ends of the cooling pipe 106 are designed such that they are situated at the bottom exterior of the deposition preventive member 101 and that they are connected respectively to the cooling medium supply pipe 107A and the cooling medium exhaust pipe 107B.

The cooling medium supply pipe 107A and the cooling medium exhaust pipe 107B are connected to a chiller unit 109 disposed outside the film-forming chamber 131. A cooling medium such as water maintained at a prescribed temperature from the chiller unit 109 is circulated through the cooling medium supply pipe 107A and the cooling medium exhaust pipe 107B. By this, the deposition preventive member 101 is cooled. Each of the cooling medium supply pipe 107A and the cooling medium exhaust pipe 107B is equipped with an insulating coupling 108 as an insulating means. By this, the deposition preventive member 101 is electrically isolated from other members.

Numeral reference 127 indicates a gas supply pipe provided with a valve capable of adjusting the flow rate of a gas supplied. A gas spouting pipe 126 is connected to the gas supply pipe. The gas spouting pipe 126 comprises a circular pipe provided with a plurality of gas liberation holes (not shown).

Sputtering gas such as Ar gas from a gas reservoir is fed through the gas supply pipe 127 and is spouted into the plasma treating region including the space between the target 121 and the substrate 116 through said plurality of gas liberation holes.

An exhaust system (not shown) is connected to the film-forming chamber 131. The exhaust system includes an exhaust port 130 provided with a gas exhaustion adjusting valve. The inside of the film-forming chamber 131 is evacuated through the exhaust port. The film-forming chamber 131 is connected to a load lock chamber 132 through a gate valve. In order to make it possible to independently evacuate the load lock chamber 132 and the film-forming chamber 131 one from another, the load lock chamber 132 is provided with an independent exhaust system (not shown) including an exhaust port 135. The load lock chamber contains a substrate transportating instrument 134. The substrate transporting instrument 134 serves to transport the substrate 116.

At the position below the film-forming chamber 131, the cooling medium supply pipe 107A and the cooling medium exhaust pipe 107B are connected to a driving motor 112. The driving motor 112 is provided with a rotary shaft. Numeral reference indicates a pinion 112A fixed to the rotary shaft. The pinion 112A is so designed as to nest into engagement with a rack 113A formed at a support member 113 connected to the bottom wall of the film-forming chamber 131. The deposition preventive member 101, which is supported by the cooling medium supply pipe 107A and the cooling medium exhaust pipe 107B, is designed so as to move up and down by virtue of the actions of the pinion 112A and the rack 113A caused upon rotating the driving motor 112.

Figure 2:
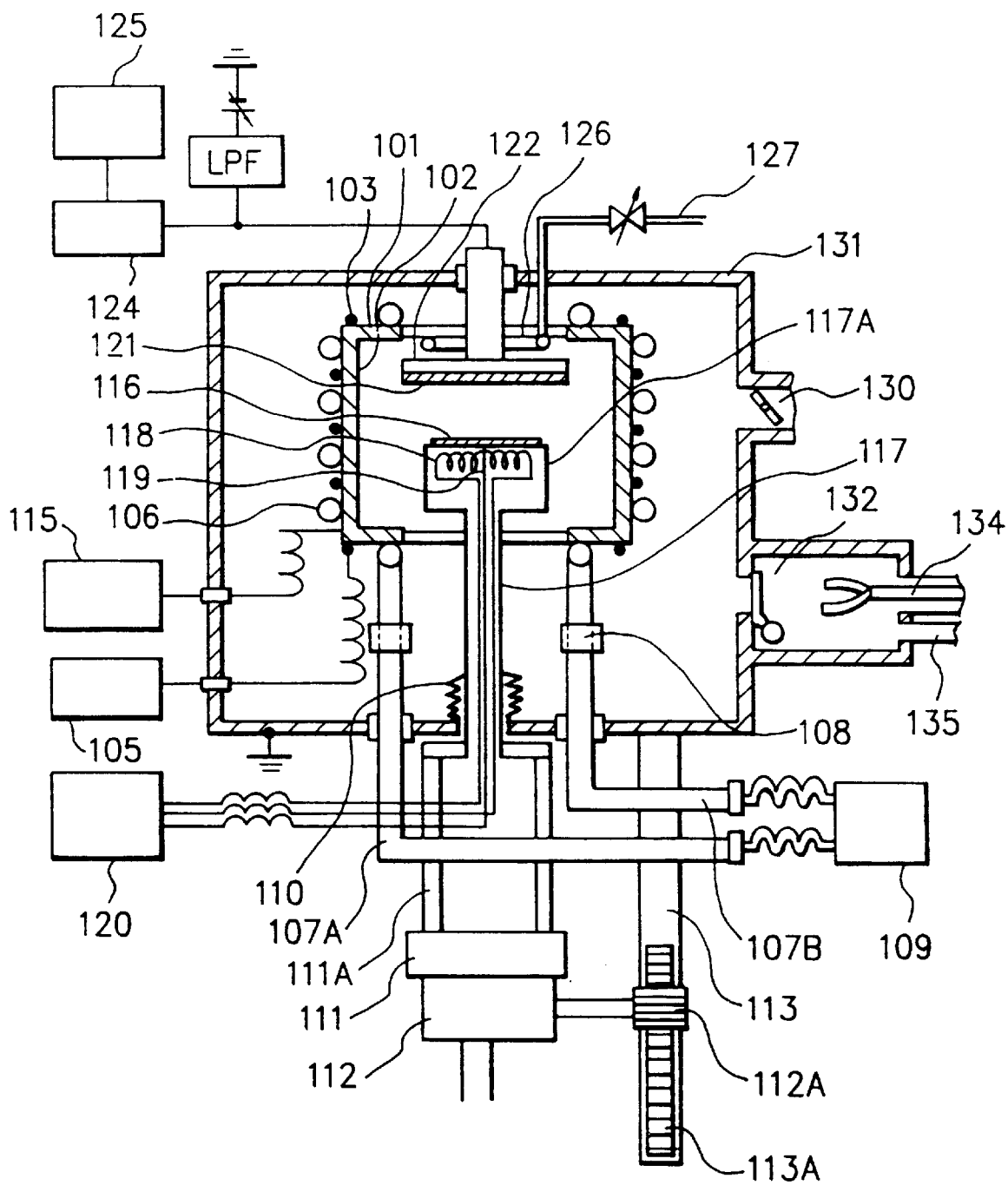
FIG. 2 is a schematic diagram of another embodiment of a film-forming apparatus by sputtering process, according to the present invention.

As another embodiment of the sputtering apparatus having the foregoing constitution, there can be mentioned an apparatus of the constitution shown in FIG. 2. The apparatus shown in FIG. 2 comprises a partial modification of the apparatus shown in FIG. 1. The reference numerals in FIG. 2 have the same meaning as in FIG. 1, unless otherwise noted.

In FIG. 2, the substrate holder 117 is disposed such that it passes through the bottom wall of the film-forming chamber 131 and that it can be slidably moved upwards and downwards while being supported by said bottom wall. A bellows seal member 110 is disposed at the portion of the film-forming chamber 131 through which the substrate holder 117 is slidably moved. The lower end portion of the substrate holder 117 is designed to have a plane face. A plurality of props 111A which are vertically mounted to the face of the motor supporting table 111 are fixed to the plane face. The driving motor 112 is fixed to the reverse face of the motor supporting table 111. An outputting shaft of the driving motor 112 is provided with the pinion 112A. The pinion 112A is so designed as to nest into engagement with the rack 113A formed at the support member 113 connected to the bottom wall of the film-forming chamber 131. Thus, the substrate holder 117 can be moved up and down by virtue of the actions of the pinion 112A and the rack 113A caused upon rotating the driving motor 112. Under the bottom wall of the film-forming chamber 131, the cooling medium supply pipe 107A and the cooling medium exhaust pipe 107B are arranged. The load lock chamber 132 having the substrate transporting instrument 134 disposed therein is connected to the film-forming chamber 131 through a side wall portion of said film-forming chamber which is situated below the position where the bottom of the deposition preventive member 101 is situated in the film-forming chamber. The load lock chamber 132 is communicated with the inside of the film-forming chamber through the gate valve. Others are the same as in the case of the apparatus shown in FIG. 1.

In the above, when the substrate 131 is introduced into or taken out from the film-forming chamber 131, the substrate holder 117 is descended to the position where the substrate 116 can be delivered onto or taken up by the substrate transporting instrument 134. Upon performing film formation, the substrate holder 117 is lifted to the position where the distance between the target 121 and the substrate 116 becomes to establish a prescribed distance. Other operations are the same as those in the case of the apparatus shown in FIG. 1.

In the apparatus shown in FIG. 1 or FIG. 2, as the means for moving the deposition preventive member or the substrate holder upon introducing or taking out the substrate, there is used the pinion-rack mechanism. However, said means is not limited only to this mechanism. Said means may be a mechanism utilizing a fluid pressure such as oil pressure or air pressure or other appropriate mechanisms.

EXAMPLES

In the following, the present invention will be described in more detail with reference to examples, but the present invention is not restricted by these examples.

Example 1 and Comparative Examples 1 to 3

Example 1

The film-forming procedures of Experiment 4 using the sputtering apparatus shown in FIG. 1 were repeated at respective substrate temperatures differing one from another at an interval of 50° C. in the range of from 300° C. to 600° C. In each case, there was formed an n-type (100) single crystalline film on a p-type (100) single crystalline Si wafer. Each of the resultant seven film samples was found to have a pn junction. As for each of the seven film samples, there was measured a reverse current density of the pn junction by means of a conventional reverse current density measuring method. The results obtained are collectively, graphically shown in FIG. 9.

Comparative Example 1

The film-forming procedures of Experiment 1 using the sputtering apparatus shown in FIG. 4 were repeated at respective substrate temperatures differing one from another at an interval of 50° C. in the range of from 300° C. to 600° C. In each case, there was formed an n-type (100) single crystalline film on a p-type (100) single crystalline Si wafer. Each of the resultant seven film samples was found to have a pn junction. As for each of the seven film samples, there was measured a reverse current density of the pn junction by means of a conventional reverse current density measuring method. The results obtained are collectively, graphically shown in FIG. 9.

Comparative Example 2

The film-forming procedures of Experiment 2 using the sputtering apparatus shown in FIG. 3 were repeated at respective substrate temperatures differing one from another at an interval of 50° C. in the range of from 300° C. to 600° C. In each case, there was formed an n-type (100) single crystalline film on a p-type (100) single crystalline Si wafer. Each of the resultant seven film samples was found to have a pn junction. As for each of the seven film samples, there was measured a reverse current density of the pn junction by means of a conventional reverse current density measuring method. The results obtained are collectively, graphically shown in FIG. 9.

Comparative Example 3

The film-forming procedures of Experiment 3 using the sputtering apparatus described in Experiment 3 were repeated at respective substrate temperatures differing one from another at an interval of 50° C. in the range of from 300° C. to 600° C. In each case, there was formed an n-type (100) single crystalline film on a p-type (100) single crystalline Si wafer. Each of the resultant seven film samples was found to have a pn junction. As for each of the seven film samples, there was measured a reverse current density of the pn junction by means of a conventional reverse current density measuring method. The results obtained are collectively, graphically shown in FIG. 9.

Figure 9:
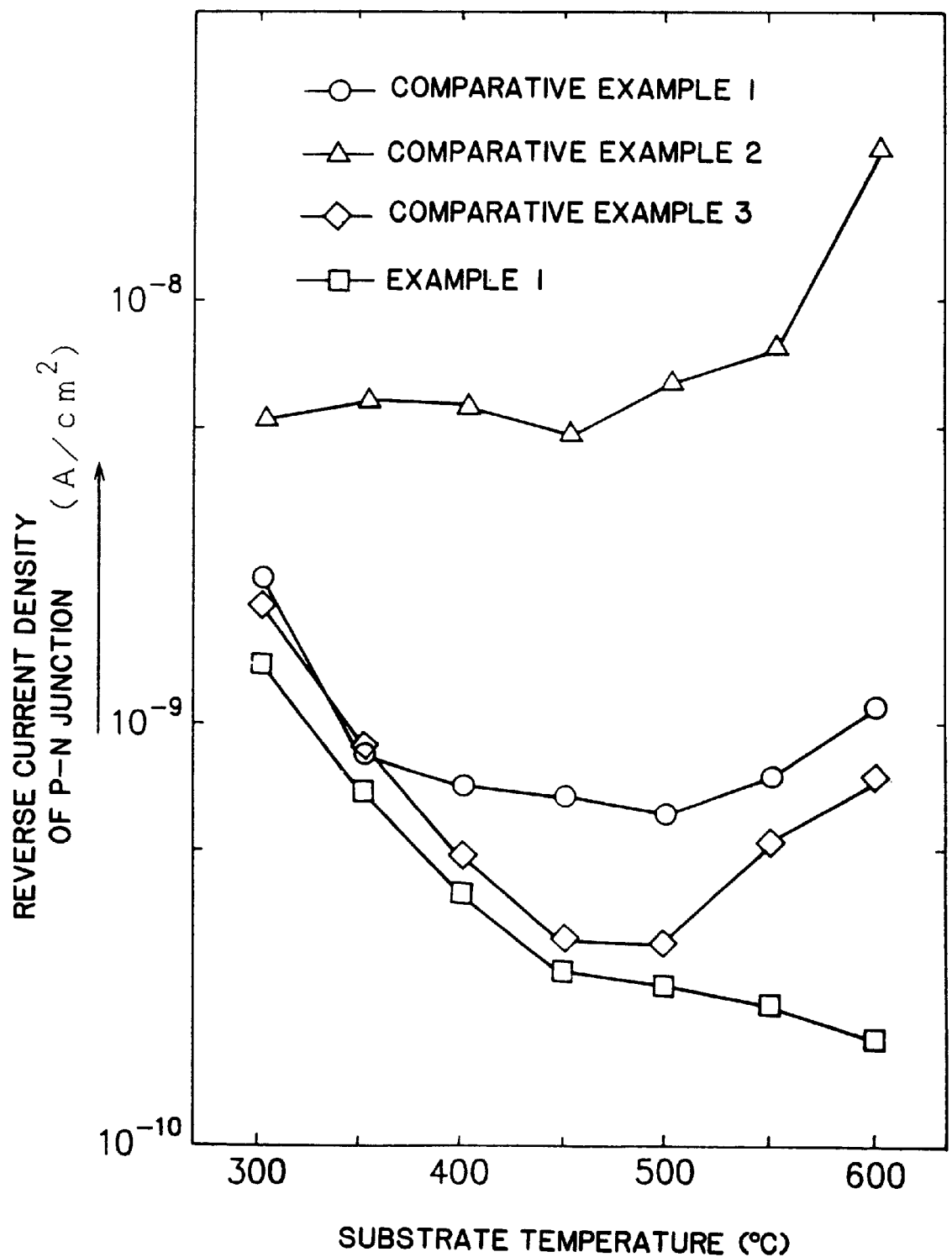
FIG. 9 is a graph showing the results obtained in Example 1, and Comparative Examples 1 to 3.

From the results shown in FIG. 9, the following findings are provided. That is, it is understood that in the case of Example 1, the reverse current density of the pn junction of a film obtained has a tendency to decrease as the substrate temperature upon film formation is increased, and the reverse current density of the pn junction of a film obtained at a substrate temperature where crystal growth desirably proceeds, specifically at a substrate temperature of 450° C. or above, is markedly low. This means that when the deposition preventive member is subjected to heat treatment prior to commencing film formation and the film formation is performed while applying a predetermined bias voltage to the deposition preventive member and while cooling the deposition preventive member, the partial gas pressures of respective gases originated from the atmospheric component gas are maintained constant at markedly reduced values even when the substrate temperature is made relatively high. Because of this, the amount of contaminants from the atmospheric component gas incorporated into a film formed is markedly reduced, whereby a high quality single crystalline semiconductor film with extremely few defects is obtained. It is also understood that the present invention is effective in the preparation of various high performance semiconductor devices.

On the other hand, as for any of the cases of Comparative Examples 1 to 3, it is understood that the reverse current density of the pn junction of a film obtained has a tendency to increase as the substrate temperature upon film formation is increased, and the reverse current density of the pn junction of a film obtained at a substrate temperature where crystal growth desirably proceeds, specifically at a substrate temperature of 450° C. or above, is markedly high, absolutely in contrast with the case of Example 1. This means that in the case where the deposition preventive member is merely subjected to heat treatment prior to commencing film formation (Comparative Example 1), in the case where only a predetermined bias voltage is applied to the deposition preventive member upon film formation (Comparative Example 2), and in the case where the deposition preventive member is subjected to heat treatment prior to commencing film formation and a predetermined bias voltage is applied upon film formation (Comparative Example 3), the partial gas pressures of respective gases originated from the atmospheric component gas rise as the substrate temperature is increased and they sharply rise at a substrate temperature exceeding 450° C. Because of this, contaminants from the atmospheric component gas are incorporated into a film formed, whereby a semiconductor film with significant defects is obtained.

Example 2 and Comparative Examples 4 to 6

Example 2

The film-forming procedures of Experiment 4 were repeated, except that a non-doped (100) single crystalline Si plate was used as the target 121, a R face of a single crystalline sapphire was used as the substrate 116, and the substrate was maintained at 550° C., to thereby obtain a single crystalline Si film. As for the resultant film, the lifetime of minority carrier was measured by means of the conventional MOS c-t method. As a result, there was obtained a high value of $1.8 \times 10^{-3}$ sec. Further, the crystalline structure of the film was observed by the conventional method. As a result, the film was found to be of a heteroepitaxially grown crystal.

Comparative Example 4

The film-forming procedures of Experiment 1 were repeated, except that a non-doped (100) single crystalline Si plate was used as the target 121, a R face of a single crystalline sapphire was used as the substrate 116, and the substrate was maintained at 550° C., to thereby obtain a Si film. As for the resultant film, the lifetime of minority carrier was measured by means of the conventional MOS c-t method. However, said lifetime of minority carrier could not be measured. Further, the crystalline structure of the film was observed by the conventional method. As a result, the film was found not to be of a heteroepitaxially grown crystal.

Comparative Example 5

The film-forming procedures of Experiment 2 were repeated, except that a non-doped (100) single crystalline Si plate was used as the target 121, a R face of a single crystalline sapphire was used as the substrate 116, and the substrate was maintained at 550° C., to thereby obtain a Si film. As for the resultant film, the lifetime of minority carrier was measured by means of the conventional MOS c-t method. However, said lifetime of minority carrier could not be measured. Further, the crystalline structure of the film was observed by the conventional method. As a result, the film was found not to be of a heteroepitaxially grown crystal.

Comparative Example 6

The film-forming procedures of Experiment 3 were repeated, except that a non-doped (100) single crystalline Si plate was used as the target 121, a R face of a single crystalline sapphire was used as the substrate 116, and the substrate was maintained at 550° C., to thereby obtain a Si film. As for the resultant film, the lifetime of minority carrier was measured by means of the conventional MOS c-t method. However, said lifetime of minority carrier could not be measured. Further, the crystalline structure of the film was observed by the conventional method. As a result, the film was found not to be of a heteroepitaxially grown crystal.

The reason why heteroepitaxial crystal growth did not occur in any of Comparative Examples 4 to 6 was investigated. As a result, it was found that in each of Comparative Examples 4 to 6, gases originating from the atmospheric component gas were greatly released and those gases released prevented the Si atoms from migrating.

I claim:

1. A film-forming method for forming a deposited film on a substrate arranged in a film-forming chamber employing plasma generated by a raw material gas in said film-forming chamber, said film-forming chamber comprising (i) a deposition preventive member arranged in said film-forming chamber such that said deposition preventive member prevents a film from depositing on an inner wall face of said film-forming chamber during the formation of said deposited film on said substrate and (ii) a heating means and (iii) a cooling means which are alternately arranged on a face side of said deposition preventive member (i) opposed to said inner wall face of said film-forming chamber; said method comprising the steps of:

(a) evacuating the inside of said film-forming chamber and subjecting said deposition preventive member to heat treatment by heating said deposition preventive member by means of said heating means prior to commencing formation of said deposited film, and (b) forming said deposited film on said substrate maintained at a desired temperature while cooling said deposition preventive member by said cooling means to prevent said deposition preventive member from releasing unnecessary components contained in said deposition preventive member due to heat radiated from said substrate and said plasma.

2. A film-forming method according to claim 1, wherein the film formation is performed while applying a predetermined bias voltage to the deposition preventive member.

3. A film-forming method according to claim 1, wherein the deposition preventive member is electroconductive.

4. A film-forming apparatus comprising a film-forming chamber in which a substrate on which a deposited film is to be deposited is positioned; a means for introducing a high frequency power to cause plasma discharge in said film-forming chamber; a deposition preventive member arranged in said film-forming chamber such that said deposition preventive member prevents a film from depositing on an inner wall face of said film-forming chamber during the formation of said deposited film on said substrate; and a heating means and a cooling means which are alternately arranged on a face side of said deposition preventive member opposite said inner wall face of said film-forming chamber, said heating means serving to heat said deposition preventive member prior to commencing formation of said deposited film on said substrate, said cooling means having a space through which a cooling medium is circulated, and said cooling means serving to prevent said deposition preventive member from being heated during the formation of said deposited film on said substrate.

5. The film-forming apparatus according to claim 4, wherein the deposition preventive member is composed of an electroconductive material.

6. The film-forming apparatus according to claim 4, wherein the space of the cooling means has a structure capable of recycling the cooling medium.

* * * * *

UNITED STATES PATENT AND TRADEMARK OFFICE
CERTIFICATE OF CORRECTION

PATENT NO. : 6,015,594
DATED      : January 18, 2000
INVENTOR(S) : TOSHIAKI YOSHIKAWA It is certified that error appears in the above-identified patent and that said Letters Patent is hereby corrected as shown below:

COLUMN 3:

Line 12, "400" should read --400 is transported--;
    Line 21, "Charge" should read --Charged--;
    Line 61, "efficiently." should read --efficiently--; and
    Line 63, "few" should read --low--.

COLUMN 4:

Line 51, "cooling-the" should read --cooling the--.

COLUMN 7:

Line 20, "content," should read --content--; and
    Line 64, "are" should be deleted.

COLUMN 8:

Line 35, "166" should read --116--.

COLUMN 10:

Line 29, "those" should be deleted.

COLUMN 11:

Line 60, "1)" should read --1) the case--.

COLUMN 13:

Line 47, "reference indicates a pinion 112A" should read --"reference 112A indicates a pinion--.

UNITED STATES PATENT AND TRADEMARK OFFICE
CERTIFICATE OF CORRECTION

PATENT NO.  :  6,015,594

DATED  :  January 18, 2000

INVENTOR(S)  :  TOSHIAKI YOSHIKAWA

It is certified that error appears in the above-identified patent and that said Letters Patent is hereby corrected as shown below:

COLUMN 16:

Line 3,  "contaminates" should read --contaminants--.

COLUMN 17:

Line 10,  "wherein the" should read --with an extremely low--; and

Line 50,  "charge" should read --charged--.

COLUMN 18:

Line 9,  "conductive, and which" should be deleted;

Line 10,  "is" should be deleted; and

Line 42,  "charge" should read --charged--.

COLUMN 21:

Line 62,  "becomes" should read --comes--.

UNITED STATES PATENT AND TRADEMARK OFFICE
CERTIFICATE OF CORRECTION

PATENT NO. : 6,015,594

DATED : January 18, 2000

INVENTOR(S) : TOSHIAKI YOSHIKAWA

It is certified that error appears in the above-identified patent and that said Letters Patent is hereby corrected as shown below:

<u>COLUMN 22</u>:

Line 15, "using-the" should read --using the--.

Signed and Sealed this

Tenth Day of April, 2001

Attest:

NICHOLAS P. GODICI

Attesting Officer     Acting Director of the United States Patent and Trademark Office